(12) United States Patent
Ishida et al.

(10) Patent No.: US 10,877,091 B2
(45) Date of Patent: Dec. 29, 2020

(54) ELECTRONIC COMPONENT HANDLER HAVING A VERTICALLY MOVABLE LIGHT SOURCE

(71) Applicant: Seiko Epson Corporation, Tokyo (JP)

(72) Inventors: Daisuke Ishida, Chino (JP); Yasushi Mizoguchi, Suwa (JP); Shuichi Wakabayashi, Okaya (JP)

(73) Assignee: Seiko Epson Corporation

( * ) Notice: Subject to any disclaimer, the term of this patent is extended or adjusted under 35 U.S.C. 154(b) by 70 days.

(21) Appl. No.: 16/255,934

(22) Filed: Jan. 24, 2019

(65) Prior Publication Data
US 2019/0227118 A1 Jul. 25, 2019

(30) Foreign Application Priority Data
Jan. 25, 2018 (JP) .................................. 2018-010855

(51) Int. Cl.
*G01R 31/28* (2006.01)

(52) U.S. Cl.
CPC .................................. *G01R 31/2893* (2013.01)

(58) Field of Classification Search
CPC ........................ G01R 31/2893; G01R 31/2867; G01R 31/01; G01R 31/26; B65G 2201/02; B65G 43/08; B65G 49/07; G01V 8/00; G01C 11/26; G06T 7/0008; G06T 7/001; G06T 2207/20212; G06T 2207/30148; H01L 21/67265; H01L 21/67333; G06F 3/14
See application file for complete search history.

(56) References Cited

U.S. PATENT DOCUMENTS

| 10,679,334 B2* | 6/2020 | Sanekata | G01R 31/2893 |
| 10,679,335 B2* | 6/2020 | Ishida | G06T 7/0008 |
| 2009/0136118 A1* | 5/2009 | Ichikawa | G01R 31/308 |
| | | | 382/145 |
| 2014/0184784 A1* | 7/2014 | Yanase | G01N 21/8803 |
| | | | 348/92 |
| 2017/0045577 A1* | 2/2017 | Ding | G01S 17/46 |
| 2019/0004104 A1* | 1/2019 | Sanekata | G01R 31/26 |

FOREIGN PATENT DOCUMENTS

| JP | 2014-196908 A | 10/2014 |
| KR | 20070101055 A | * 10/2007 |

* cited by examiner

*Primary Examiner* — Vinh P Nguyen
(74) *Attorney, Agent, or Firm* — Harness, Dickey & Pierce, P.L.C.

(57) ABSTRACT

An electronic component handler that transports an electronic component to an electronic component placement unit on which the electronic component is placed includes: a transport unit that transports the electronic component; a light irradiation unit that irradiates the electronic component placement unit with light; and a vertical direction moving mechanism unit that has a guide that supports the light irradiation unit and guides the light irradiation unit in a vertical direction.

9 Claims, 16 Drawing Sheets

ELECTRONIC COMPONENT HANDLER HAVING A VERTICALLY MOVABLE LIGHT SOURCE

BACKGROUND

1. Technical Field

The present invention relates to an electronic component handler and an electronic component tester.

2. Related Art

In the related art, a tester that performs electric test on electronic components such as an IC device, for example, is known (see JP-A-2014-196908, for example. The tester described in JP-A-2014-196908 is configured such that an IC device is transported to a test socket, is then placed on the test socket, and is subjected to test in a case in which test is performed on the IC device. According to the tester described in JP-A-2014-196908, it is determined whether or not the IC device remains on the test socket, that is, whether or not the IC device is present prior to the test on the IC device. It is necessary to make this determination since there is a concern that the IC device to be tested overlaps with the remaining device and an accurate test result is not obtained in a case in which the IC device remains on the test socket, for example. According to the tester described in JP-A-2014-196908, two images are obtained at different imaging timings (before and after the transport of the IC device), a difference (image difference) between these two images is detected, and the determination regarding whether or not the IC device is present is made on the basis of a result of the detection.

However, according to the tester described in JP-A-2014-196908, it is not possible to adjust a position and the like of a laser light source for emitting slit light in the aforementioned tester while it is necessary to adjust the position (especially, the position in the vertical direction) and the orientation of the laser power source.

SUMMARY

An advantage of some aspects of the invention is to solve at least a part of the problems described above, and the invention can be implemented as the following configurations.

An electronic component handler according to an aspect of the invention includes: a transport unit that transports an electronic component; a region in which an electronic component placement unit on which the electronic component is placed is able to be disposed; a light irradiation unit that is able to irradiate the electronic component placement unit with light; and a vertical direction moving mechanism unit that movably supports the light irradiation unit such that the position thereof in the vertical direction changes.

It is preferable that the vertical direction moving mechanism unit has a guide that guides the light irradiation unit in the vertical direction.

It is preferable that the vertical direction moving mechanism unit has a decelerator that decelerates moving speed of the light irradiation unit.

It is preferable that the vertical direction moving mechanism unit has a movement adjustment unit that adjusts a position of the light irradiation unit at a destination of movement when the movement of the light irradiation unit stops.

It is preferable that the light irradiation unit has a plurality of laser light sources that emit laser light.

It is preferable that the light irradiation unit is a light source unit in which the plurality of laser light sources are integrated as a unit.

It is preferable that the vertical direction moving mechanism unit is configured such that the vertical direction moving mechanism is able to independently move the respective laser light sources.

It is preferable that the vertical direction moving mechanism unit is configured such that the vertical direction moving mechanism unit is able to collectively move the respective laser light sources in the same direction.

It is preferable that the respective laser light sources are disposed in the vertical direction and that the laser light sources located on further upward are used such that angles relative to the vertical direction of the laser light sources are small.

It is preferable that the electronic component handler includes a turning mechanism unit that supports the light irradiation unit such that the light irradiation unit is able to turn.

It is preferable that the turning mechanism unit has a decelerator that decelerates an angular speed of the light irradiation unit.

It is preferable that the turning mechanism unit has a turning adjustment unit that adjusts a position of the light irradiation unit at a destination of turning when the turning of the light irradiation unit stops.

It is preferable that the light irradiation unit has a plurality of laser light sources that emit laser light and that the turning mechanism unit is configured to support the respective laser light sources such that the respective laser light sources are able to independently turn.

It is preferable that the electronic component handler includes a horizontal direction moving mechanism unit that movably supports the light irradiation unit in a horizontal direction.

It is preferable that the electronic component handler includes an imaging unit that images the electronic component placement unit.

An electronic component tester according to another aspect of the invention includes: a transport unit that transports an electronic component; a test unit that has an electronic component placement unit on which the electronic component is placed and that is able to test the electronic component placed on the electronic component placement unit; a region in which the test unit is able to be disposed; a light irradiation unit that is able to irradiate the electronic component placement unit with light; and a vertical direction moving mechanism unit that movably supports the light irradiation unit such that a position thereof in the vertical direction changes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic component handler and an electronic component tester according to the invention will be described in detail on the basis of preferred embodiments illustrated in the accompanying drawings.

First Embodiment

Figure 1:
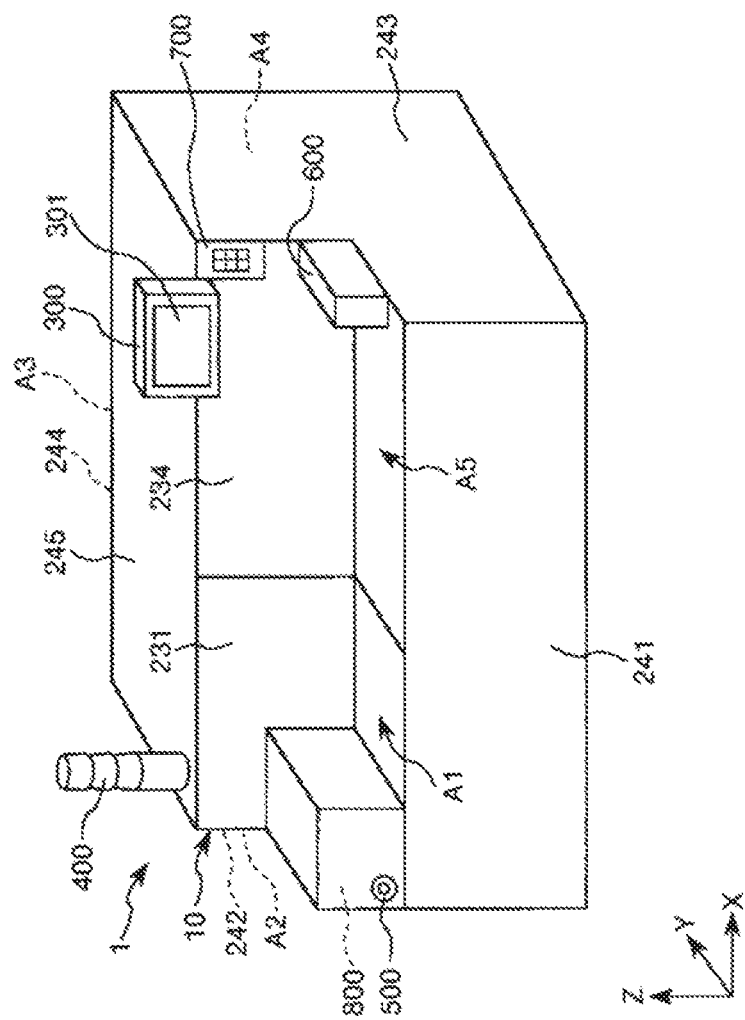
FIG. 1 is a schematic perspective view of an electronic component tester according to a first embodiment of the invention when viewed from a front side.

Hereinafter, an electronic component handler and an electronic component tester according to a first embodiment of the invention will be described with reference to FIGS. 1 to 15. Note that three axes that perpendicularly intersect one another will be assumed to be an X axis, a Y axis, and a Z axis below as illustrated in FIG. 1 for convenience of description. An XY plane that includes the X axis and the Y axis is horizontal, and the Z axis is vertical. That is, the Z axis extends on a vertical line. The direction in parallel with the X axis will also be referred to as an "X direction (first direction)", the direction in parallel with the Y axis will also be referred to as a "Y direction (second direction)", and the direction in parallel with the Z axis will also be referred to as a "Z direction (third direction)". Also, the direction in which the arrow in each direction is directed will be referred to as a "positive" side while the direction opposite thereto will be referred to as a "negative side". The "horizontal" state described herein is not limited to a completely horizontal state and also includes a slightly (less than about 50, for example) inclined state relative to the horizontal state as long as transport of an electronic component is not inhibited. Also, the "vertical" state described herein is not limited to a completely vertical state and also includes a slightly (less than about 50, for example) inclined state relative to the vertical state as long as transport of an electronic component is not inhibited. The upper side in FIGS. 1, 4 to 7, 9, and 11 to 15 (the same is true for FIGS. 16, 17, and 19), that is, the positive side in the Z axis direction may be referred to as "upper" or "above" while the lower side, that is, the negative side in the Z axis direction may be referred to as "lower" or "below".

An electronic component handler 10 according to the invention is a handler that has an appearance illustrated in FIG. 1. As illustrated in FIGS. 3 to 7, the electronic component handler 10 includes a transport unit 25 that transports an IC device 90 that is an electronic component, a test region A3 (region) in which a test unit 16 that serves as an electronic component placement unit 26 on which the IC device 90 (electronic component) is placed can be disposed, a light irradiation unit 4 that can irradiate the test unit 16 (electronic component placement unit 26) with laser light L41 (light), and a vertical direction moving mechanism unit 6 that movably supports the light irradiation unit 4 such that the position thereof in the Z direction (vertical direction) changes.

In this manner, it is possible to appropriately adjust the position of the light irradiation unit 4 in the Z direction even if the test unit 16 is replaced with one with a recessed portion 161 at a changed position as will be described later. In this manner, it is possible to emit the laser light L41 from the light irradiation unit 4 regardless of the position of the recessed portion 161. Also, it is possible to accurately detect remaining of the IC device 90 relative to the recessed portion 161 on the basis of a projection shape of the laser light L41 on the recessed portion 161, for example.

Note that although the electronic component placement unit 26 is applied to the test unit 16 in the embodiment, the invention is not limited thereto, and the electronic component placement unit 26 may be applied to temperature adjustment units 12, device supply units 14, device collection units 18, collection trays 19, or trays 200, which will be described later.

Figure 2:
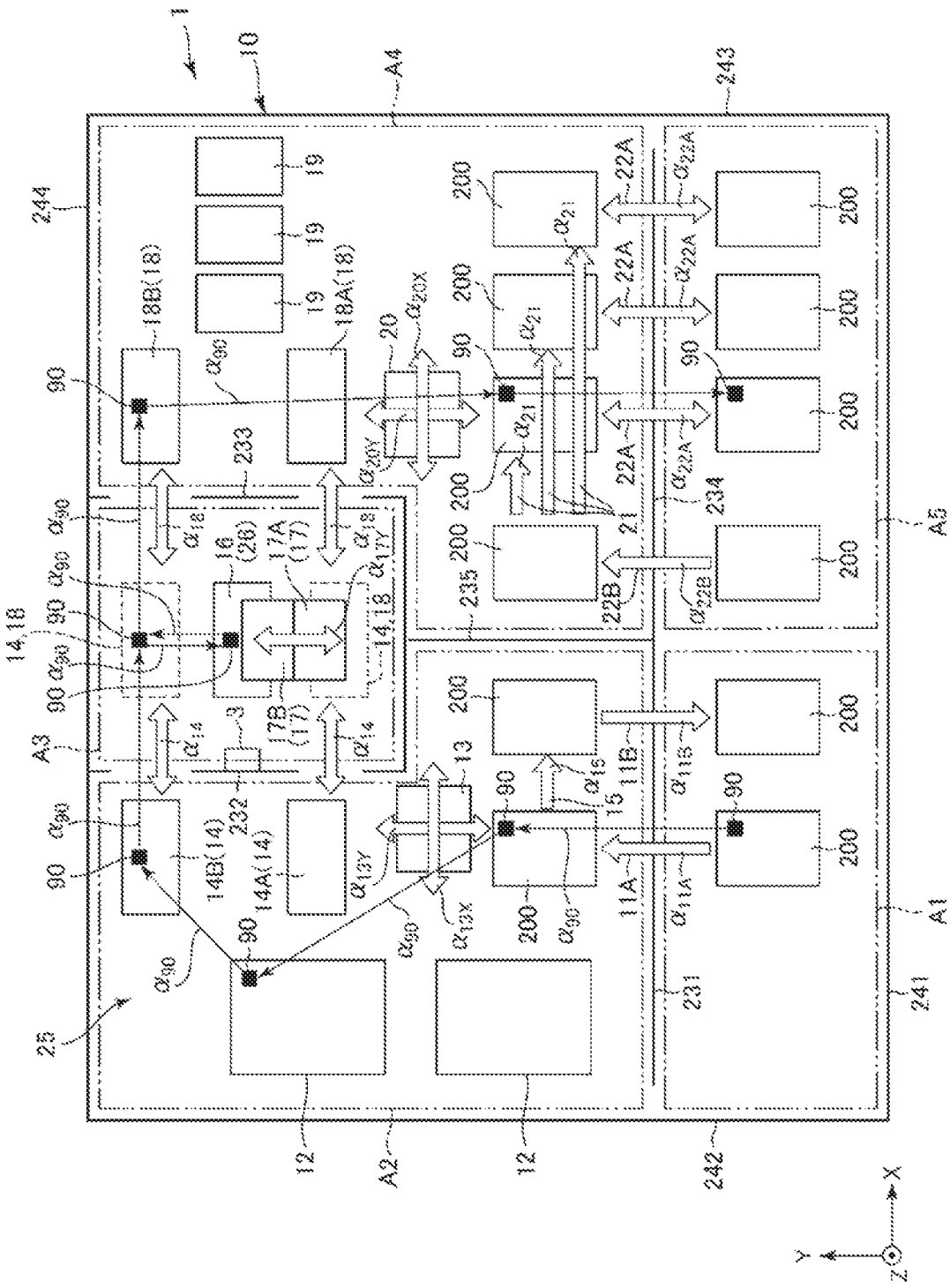
FIG. 2 is a schematic plan view illustrating an operation state of the electronic component tester illustrated in FIG. 1.

As illustrated in FIG. 2, an electronic component tester 1 according to the invention is a test system that includes the electronic component handler 10 and further includes a test unit 16 that tests an electronic component. That is, the electronic component tester 1 includes the transport unit 25 that transports the IC device 90 that is an electronic component, the test unit 16 that has the electronic component placement unit 26 on which the IC device 90 (electronic component) is placed and that can test the IC device 90

(electronic component) placed on the electronic component placement unit 26, the test region A3 (region) in which the test unit 16 can be disposed, the light irradiation unit 4 that can irradiate the test unit 16 (electronic component placement unit 26) with the laser light L41 (light), and the vertical direction moving mechanism unit 6 that movably supports the light irradiation unit 4 such that the position thereof in the Z direction (vertical direction) changes.

In this manner, the electronic component tester 1 that has advantages of the aforementioned electronic component handler 10 is obtained. Also, it is possible to transport the IC device 90 to the test unit 16 and to perform test on the IC device 90 by the test unit 16. In addition, it is possible to transport the IC device 90 after the test from the test unit 16.

Hereinafter, configurations of the respective parts will be described in detail.

As illustrated in FIGS. 1 and 2, the electronic component tester 1 that has the electronic component handler 10 is a device that transports an electronic component such as an IC device with a ball grid array (BGA) package, for example, and inspects and tests (hereinafter, simply referred to as "test") electronic properties of the electronic component in the process of the transport. Note that a case in which the IC device is used as the electronic component will be described as a representative case below and this will be assumed to be the "IC device 90" for convenience of description. The IC device 90 has a flat plate shape in the embodiment.

Examples of the IC device include a "large scale integration (LSI)", a "complementary MOS (CMOS)", a "charge coupled device (CCD)", a "module IC" in which a plurality of modules are packaged as an IC device, a "quartz device", a "pressure sensor", an "inertial sensor (acceleration sensor)", a "gyro sensor", and a "fingerprint sensor" as well as the examples described above.

The electronic component tester 1 (electronic component handler 10) includes a tray supply region A1, a device supply region A2, the test region A3, a device collection region A4, and a tray removal region A5, and these regions are sectioned by the respective walls as will be described later. The IC device 90 passes through the respective regions from the tray supply region A1 to the tray removal region A5 in order in the direction of the arrow α90, and test is performed thereon in the test region A3 on the way. In this manner, the electronic component tester 1 includes the electronic component handler 10 that has the transport unit 25 for transporting the IC device 90 via the respective regions, the test unit 16 that performs test in the test region A3, and a control unit 800. Also, the electronic component tester 1 includes a monitor 300, a signal lamp 400, and an operation panel 700.

Note that the side on which the tray supply region A1 and the tray removal region A5 are disposed in the electronic component tester 1, that is, a lower side in FIG. 2 is used as the front side while the side on which the test region A3 is disposed, that is, the upper side in FIG. 2 is used as the rear side.

The electronic component tester 1 is used with components that are replaced depending on each type of the IC device 90, are called "change kits", and are mounted thereon in advance. The change kits include, for example, the temperature adjustment units 12, the device supply units 14, and the device collection units 18. In addition to such change kits, the trays 200, the collection trays 19, and the test unit 16 that a user prepare, for example, are also replaced depending on each type of the IC device 90.

The tray supply region A1 is a material feeding portion to which a tray 200 with a plurality of aligned IC devices 90 in an untested state is supplied. The tray supply region A1 can also be referred to as a placing region in which a plurality of trays 200 can be placed in a piled-up manner. Note that a plurality of recessed portions (pockets) are arranged in a matrix shape in each tray 200 according to the embodiment. It is possible to accommodate and place the IC device 90 one by one in each recessed portion.

The device supply region A2 is a region through which the plurality of IC devices 90 on the trays 200, which have been transported from the tray supply region A1, are respectively transported and supplied to the test region A3. Note that a tray transport mechanism 11A and a tray transport mechanism 11B that transport the trays 200 in the horizontal direction one by one are provided such that the tray transport mechanism 11A and the tray transport mechanism 11B extend across the tray supply region A1 and the device supply region A2. The tray transport mechanism 11A is a part of the transport unit 25 and can move the trays 200 on the positive side in the Y direction, that is, in the direction of the arrow α11A in FIG. 2 along with the IC devices 90 placed on the trays 200. In this manner, it is possible to stably feed the IC devices 90 to the device supply region A2. Also, the tray transport mechanism 11B can move vacant trays 200 on the negative side in the Y direction, that is, in the direction of the arrow α11B in FIG. 2. In this manner, it is possible to move the vacant trays 200 from the device supply region A2 to the tray supply region A1.

In the device supply region A2, the temperature adjustment unit (soak plate) 12, a device transport head 13, and a tray transport mechanism 15 are provided. Also, the device supply units 14 that move across the device supply region A2 and the test region A3 is also provided.

The temperature adjustment units 12 are called "soak plates" that are adapted such that the plurality of IC devices 90 are placed thereon and that can collectively heat or cool down the IC devices 90 placed thereon. With this soak plate, it is possible to heat or cool down the IC devices 90 before test performed by the test unit 16 in advance and to adjust a temperature to a temperature suitable for the test (high-temperature test or low-temperature test).

The temperature adjustment units 12 that serve as such placement units are secured. In this manner, it is possible to stably adjust the temperature for the IC devices 90 on the temperature adjustment units 12.

Also, the temperature adjustment units 12 are grounded.

In the configuration illustrated in FIG. 2, two temperature adjustment units 12 are disposed and secured in the Y direction. Then, the IC devices 90 on the tray 200, which has been transported from the tray supply region A1 by the tray transport mechanism 11A, is transported to any of the temperature adjustment units 12.

The device transport head 13 is for gripping the IC devices 90, is supported such that the device transport head 13 can move in the X direction and the Y direction in the device supply region A2, and is further supported such that the device transport head 13 can also move in the Z direction. The device transport head 13 is also a part of the transport unit 25 and can be in charge of transport of the IC devices 90 between the trays 200 that have been transported from the tray supply region A1 and the temperature adjustment units 12 and transport of the IC devices 90 between the temperature adjustment units 12 and the device supply units 14, which will be described later. Note that movement of the device transport head 13 in the X direction is represented by the arrow α13X while movement of the device transport head 13 in the Y direction is represented by the arrow α13Y in FIG. 2.

The device supply units 14 are called "supply shuttle plates" or simply "supply shuttles" that are adapted such that the IC devices 90 at a temperature adjusted by the temperature adjustment units 12 are placed thereon and that are capable of transporting the IC devices 90 to the vicinity of the test unit 16. The device supply units 14 can also be a part of the transport unit 25. The device supply units 14 have recessed portions (pockets) in which the IC devices 90 are accommodated and placed.

The device supply units 14 are supported such that the device supply units 14 can reciprocate (move) in the X direction, that is, the direction of the arrow α14 between the device supply region A2 and the test region A3. In this manner, the device supply units 14 can stably transport the IC devices 90 from the device supply region A2 to the vicinity of the test unit 16 in the test region A3 and can return to the device supply region A2 again after the IC devise 90 are removed by the device transport heads 17 in the test region A3.

In the configuration illustrated in FIG. 2, two device supply units 14 are disposed in the Y direction, and the device supply unit 14 on the negative side in the Y direction may be referred to as a "device supply unit 14A" while the device supply unit 14 on the positive side in the Y direction may be referred to as a "device supply unit 14B". The IC devices 90 on the temperature adjustment units 12 are transported to the device supply unit 14A or the device supply unit 14B in the device supply region A2. The device supply units 14 are configured to be able to heat or cool down the IC devices 90 placed on the device supply units 14 similarly to the temperature adjustment units 12. In this manner, it is possible to maintain a temperature adjusted state of the IC devices 90 at a temperature adjusted by the temperature adjustment units 12 and to transport the IC devices 90 to the vicinity of the test unit 16 in the test region A3. The device supply units 14 are also grounded similarly to the temperature adjustment units 12.

The tray transport mechanism 15 is a mechanism that transports the vacant trays 200 in a state in which all the IC devices 90 have been removed therefrom on the positive side in the X direction, that is, the direction of the arrow α15 in the device supply region A2. Then, the vacant trays 200 are returned from the device supply region A2 to the tray supply region A1 by the tray transport mechanism 11B after the transport.

The test region A3 is a region in which the IC devices 90 are tested. In the test region A3, the test unit 16 that tests the IC devices 90 and the device transport heads 17 are provided.

The device transport heads 17 are a part of the transport unit 25 and are configured to be able to heat or cool down the gripped IC devices 90 similarly to the temperature adjustment units 12. As illustrated in FIGS. 4 to 7, the device transport heads 17 have gripping units 171 that grip the IC devices 90 (electronic components) through adsorption below the device transport heads 17. In this manner, it is possible to grip the IC devices 90 maintained in the temperature adjusted state and to transport the IC devices 90 in the test region A3 while maintaining the temperature adjusted state. Note that the number of gripping units 171 mounted is not limited to the number illustrated in FIGS. 4 to 7.

Such device transport heads 17 are supported such that the device transport heads 17 can reciprocate in the Y direction and the Z direction in the test region A3 and serves as a part of a mechanism called an "index arm". In this manner, the device transport heads 17 can lift the IC devices 90 from the device supply units 14 that have been transported from the device supply region A2 and transport and place the IC devices 90 to and on the test unit 16.

Figure 3:
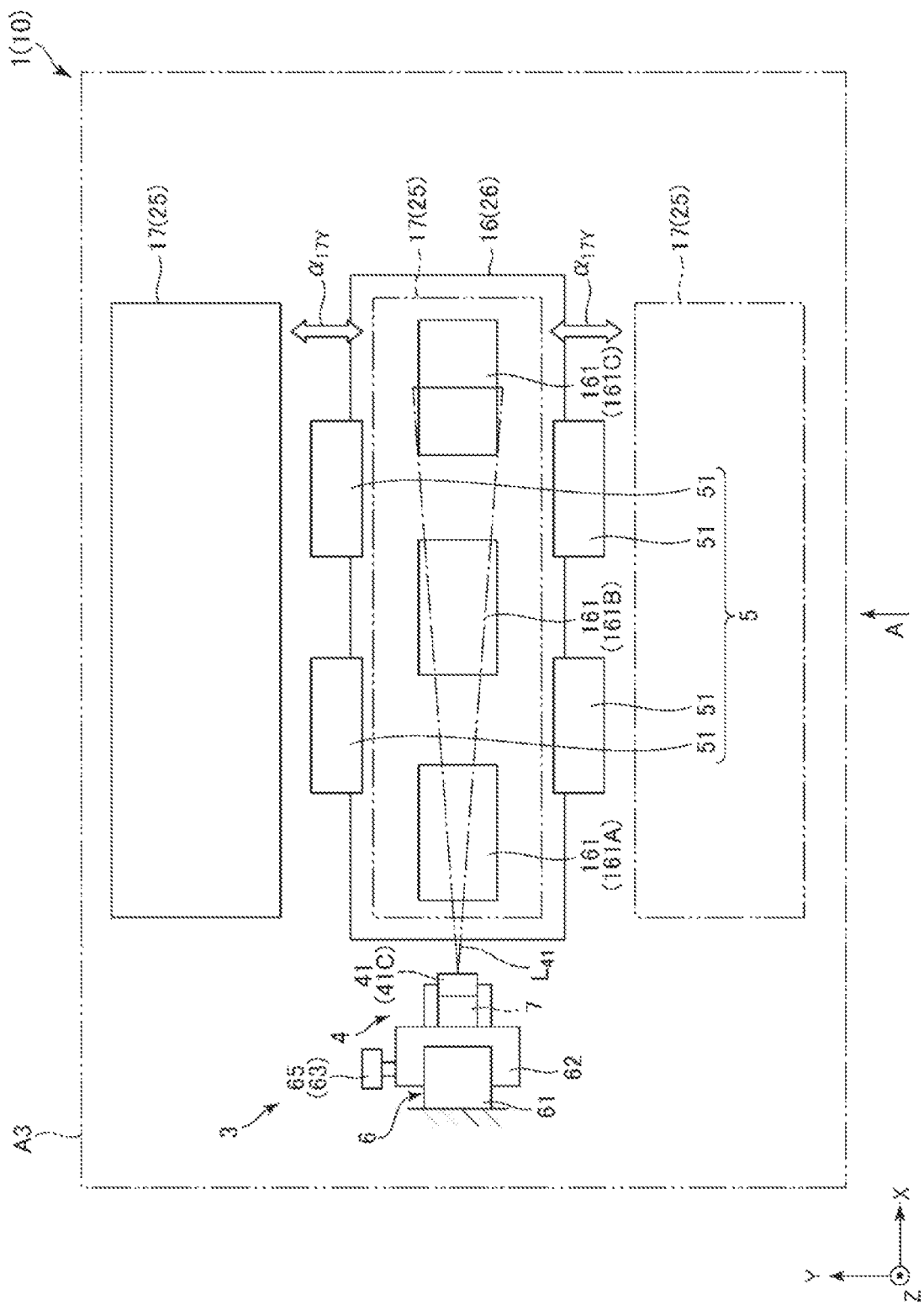
FIG. 3 is an enlarged plan view in a test region in FIG. 2.

Note that the reciprocation of the device transport heads 17 in the Y direction is represented by the arrow α17Y in FIGS. 2 and 3. As illustrated in FIG. 3, the device transport heads 17 can be in charge of transport of the IC devices 90 from the device supply unit 14A to the test unit 16 (see the device transport head 17 represented by the solid line on the upper side and the device transport head 17 represented by the two-dotted chain line at the center in FIG. 3) and transport of the IC devices 90 from the device supply unit 14B to the test unit 16 (see the device transport head 17 represented by the two-dotted chain line on the lower side and the device transport head 17 represented by the two-dotted chain line at the center in FIG. 3) in the test region A3. Although the device transport heads 17 are supported such that the device transport heads 17 can reciprocate in the Y direction, the invention is not limited thereto, and the device transport heads 17 may be supported such that the device transport heads 17 can also reciprocate in the X direction.

In the embodiment, two device transport heads 17 are disposed in the Y direction (see FIG. 2). Hereinafter, the device transport head 17 on the negative side in the Y direction may be referred to as a "device transport head 17A" while the device transport head 17 on the positive side in the Y direction may be referred to as a "device transport head 17B". The device transport head 17A can be in charge of transport of the IC devices 90 from the device supply unit 14A to the test unit 16 in the test region A3 while the device transport head 17B can be in charge of transport of the IC devices 90 from the device supply unit 14B to the test unit 16 in the test region A3. Also, the device transport head 17A can be in charge of transport of the IC devices 90 from the test unit 16 to the device collection unit 18A in the test region A3 while the device transport head 17B can be in charge of transport from the test unit 16 to the device collection unit 18B in the test region A3.

The test unit 16 (socket) can test electric properties of the IC devices 90 with the IC devices 90 as electronic components placed thereon. As illustrated in FIGS. 3 to 7, the test unit 16 has recessed portions (pockets) 161 in which the IC devices 90 are accommodated and placed, and a plurality of probe pins (not illustrated) are provided on bottom surfaces 162 of the recessed portions 161. It is possible to perform test on the IC devices 90 by terminals of the IC devices being connected to the probe pins in a conductive manner, that is, by the terminals of the IC devices 90 being brought into contact with the probe pins. The test of the IC devices 90 is performed on the basis of a program that is stored in an test control unit provided in a tester that is connected to the test unit 16.

Note that three recessed portions 161 are arranged at intervals in the X direction as illustrated in FIG. 3 in one example of the embodiment, and the recessed portions may be called a "recessed portion 161A", a "recessed portion 161B", and a "recessed portion 161C" in order from the negative side in the X direction. The arrangement mode (the number of arranged recessed portions 161 in the X direction and the number of arranged recessed portions 161 in the Y direction) and the total number of arranged recessed portions 161 are not limited to those illustrated in FIG. 3.

Such a test unit 16 can heat or cool down the IC devices 90 and adjust the temperature of the IC devices 90 to a temperature suitable for the test similarly to the temperature adjustment units 12.

The device collection region A4 is a region in which the plurality of IC devices 90, which have been tested in the test region A3 and have completed the test, are collected. In the device collection region A4, the collection trays 19, a device transport head 20, and a tray transport mechanism 21 are provided. Also, the device collection units 18 that move across the test region A3 and the device collection region A4 are also provided. In addition, vacant trays 200 are also prepared in the device collection region A4.

The device collection units 18 are called "collection shuttle plates" or simply "collection shuttles" that are adapted such that the IC devices 90 which have completed test using the test unit 16 are placed thereon and that transports the IC devices 90 to the device collection region A4. The device collection units 18 can also be a part of the transport unit 25.

The device collection units 18 are supported such that the device collection units 18 can reciprocate in the X direction, that is, in the direction of the arrow α18 between the test region A3 and the device collection region A4. In the configuration illustrated in FIG. 2, two device collection units 18 are disposed in the Y direction similarly to the device supply units 14, and the device collection unit 18 on the negative side in the Y direction may be referred to as a "device collection unit 18A" while the device collection unit 18 on the positive side in the Y direction may be referred to as a "device collection unit 18B. The IC devices 90 on the test unit 16 are transported to the device collection unit 18A or the device collection unit 18B and placed thereon. As illustrated in FIG. 3, the device transport heads 17 can be in charge of transport of the IC devices 90 from the test unit 16 to the device collection unit 18A (see the device transport head 17 represented by the two-dotted chain line at the center and the device transport head 17 represented by the solid line on the upper side in FIG. 3) in the test region A3 and transport of the IC devices 90 from the test unit 16 to the device collection unit 18B (see the device transport head 17 represented by the two-dotted chain line at the center and the device transport head 17 represented by the two-dotted chain line on the lower side in FIG. 3). The device collection units 18 are also grounded similarly to the temperature adjustment units 12 and the device supply units 14.

The collection trays 19 are adapted such that IC devices 90 which have been tested by the test unit 16 are placed thereon and are secured such that the collection tray 19 does not move in the device collection region A4. In this manner, the IC devices 90 after the test are stably placed on the collection trays 19 even in the device collection region A4 in which a relatively large number of various movable portions such as the device transport head 20 are disposed. Note that three collection trays 19 are disposed in the X direction in the configuration illustrated in FIG. 2.

Three vacant trays 200 are disposed in the X direction. The IC devices 90 that have been tested by the test unit 16 are also placed on the vacant trays 200. Then, the IC devices 90 on the device collection units 18 that have moved to the device collection region A4 are transported to and placed on either the collection trays 19 or the vacant trays 200. In this manner, the IC devices 90 are classified and collected depending on each test result.

The device transport head 20 has a part that is supported such that the part can move in the X direction and the Y direction and can also move in the Z direction in the device collection region A4. The device transport head 20 is a part of the transport unit 25 and can transport the IC devices 90 from the device collection units 18 to the collection trays 19 or the vacant trays 200. Note that movement of the device transport head 20 in the X direction is represented by the arrow α20X while movement of the device transport head 20 in the Y direction is represented by the arrow α20Y in FIG. 2.

The tray transport mechanism 21 is a mechanism that transports a vacant tray 200, which has been transported from the tray removal region A5, in the X direction, that is, the direction of the arrow α21 in the device collection region A4. After the transport, the vacant tray 200 is disposed at a position at which the IC devices 90 are collected, that is, the vacant tray 200 can be any one of the three vacant trays 200.

The tray removal region A5 is a removing member at which the trays 200 on which the plurality of IC devices 90 in the tested state are aligned are collected and removed. In the tray removal region A5, multiple trays 200 can be piled up.

A tray transport mechanism 22A and a tray transport mechanism 22B that transport the trays 200 one by one in the Y direction across the device collection region A4 and the tray removal region A5. The tray transport mechanism 22A is a part of the transport unit 25 and can cause the trays 200 to reciprocate in the Y direction, that is, the direction of the arrow α22A. In this manner, it is possible to transport the IC devices 90 after the test from the device collection region A4 to the tray removal region A5. The tray transport mechanism 22B can move the vacant trays 200 for collecting the IC devices 90 on the positive side in the Y direction, that is, the direction of the arrow α22B. In this manner, it is possible to move the vacant trays 200 from the tray removal region A5 to the device collection region A4.

The control unit 800 can control operations of the respective parts, namely, the tray transport mechanism 11A, the tray transport mechanism 11B, the temperature adjustment units 12, the device transport head 13, the device supply units 14, the tray transport mechanism 15, the test unit 16, the device transport heads 17, the device collection units 18, the device transport head 20, the tray transport mechanism 21, the tray transport mechanism 22A, the tray transport mechanism 22B, and the light irradiation unit 4 and an imaging unit 5 in a remaining detection unit 3, which will be described later.

An operator can set or check operation conditions of the electronic component tester 1 via the monitor 300. The monitor 300 has a display screen 301 including a liquid crystal screen, for example, and is arranged above the electronic component tester 1 on the front side. As illustrated in FIG. 1, a mouse table 600 on which a mouse is placed is provided on the right side of the tray removal region A5 in the drawing. The mouse is used to operate a screen displayed on the monitor 300.

An operation panel 700 is disposed below the monitor 300 on the right side in FIG. 1. The operation panel 700 is provided separately from the monitor 300 and is for providing a command for a desired operation to the electronic component tester 1.

The signal lamp 400 can provide notifications of operation states or the like of the electronic component tester 1 by combining colors of emitted light. The signal lamp 400 is disposed above the electronic component tester 1. Note that a speaker 500 is incorporated in the electronic component tester 1 and that it is possible to provide notifications of operation states or the like of the electronic component tester 1 by the speaker 500.

In the electronic component tester 1, a first barrier wall 231 sections between the tray supply region A1 and the device supply region A2, a second barrier wall 232 sections between the device supply region A2 and the test region A3, a third barrier wall 233 sections between the test region A3 and the device collection region A4, and a fourth barrier wall 234 sections between the device collection region A4 and the tray removal region A5. A fifth barrier wall 235 also sections between the device supply region A2 and the device collection region A4.

The outermost exterior of the electronic component tester 1 is covered with covers, and the covers include, for example, a front cover 241, a side cover 242, a side cover 243, a rear cover 244, and a top cover 245.

As described above, the test unit 16 that can perform test with the IC devices 90 placed thereon is disposed in the test region A3. According to the electronic component tester 1, it is detected whether or not there are IC devices 90 in the recessed portions 161 in the test unit 16, that is, remaining of the IC devices 90 before test when the test of the IC devices 90 is performed with the test unit 16. The remaining is detected for the following reason, for example.

In a case in which the IC devices 90 remain in the recessed portions 161 of the test unit 16 (hereinafter, the IC devices 90 will be referred to as "remaining devices"), next IC devices 90 to be tested in the recessed portions 161 (hereinafter, the IC devices 90 will be referred to as "untested devices") are placed such that the IC devices 90 are overlaid on the remaining devices. There is a concern that it becomes difficult to accurately perform test on the untested devices in such a state. Therefore, it is preferable that the test unit 16 detects remaining of the IC devices 90.

Thus, the electronic component tester 1 includes the remaining detection unit 3 that detects remaining of the IC devices 90 in the test unit 16. As illustrated in FIGS. 3 to 7, the remaining detection unit 3 has a light irradiation unit (illumination unit) 4 that illuminates the test unit 16 and the imaging unit 5 that images the test unit 16 illuminated by the light irradiation unit 4.

Figure 4:
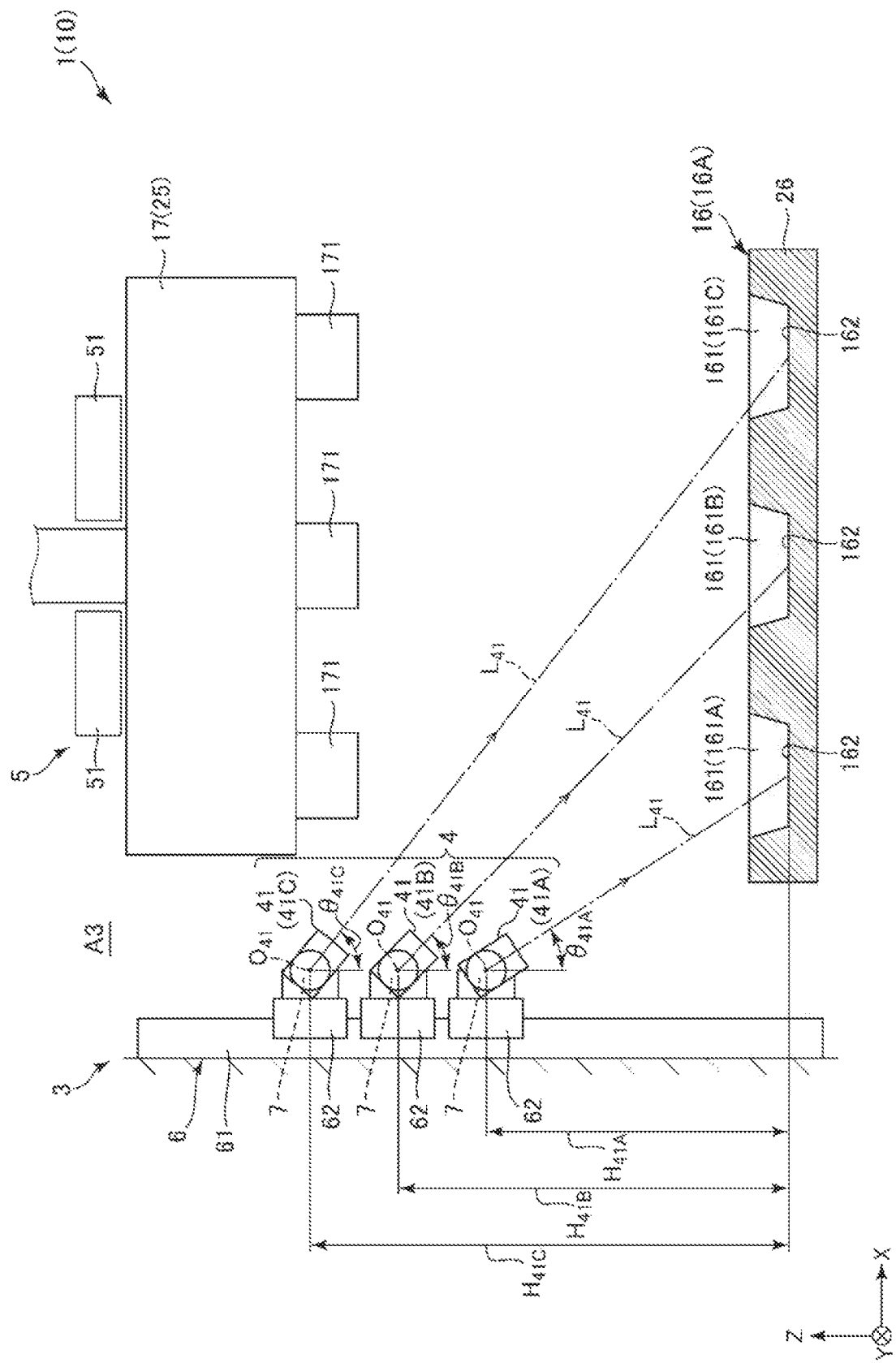
FIG. 4 is a partial sectional view (example) when viewed in the direction of the arrow A in FIG. 3.

As illustrated in FIG. 4 (the same is true for FIGS. 5 to 7), the light irradiation unit 4 is disposed on an obliquely left upper side relative to the test unit 16, that is, on the negative side in the X direction and on the positive side in the Z direction relative to the test unit 16. The light irradiation unit 4 is a light source unit that has three (a plurality of) laser light sources 41 in the embodiment. These laser light sources 41 are disposed at intervals in the Z direction and may be referred to as a "light source 41A", a "laser light source 41B", and a "laser light source 41C" I order from the negative side in the Z direction. Note that the laser light sources 41 are not particularly limited, and semiconductor laser light sources or another type of laser light sources can be used, for example. In a case in which a plurality of laser light sources 41 are provided, the arrangement thereof is not limited to alignment in the Z direction, and the plurality of laser light sources 41 may be aligned in any of the X direction, the Y direction, and the Z direction.

The laser light source 41A can irradiate the recessed portion 161A of the test unit 16 with the laser light L41 that serves as slit light in the Y direction.

The laser light source 41B can irradiate the recessed portion 161B of the test unit 16 with the laser light L41 that serves as slit light in the Y direction.

The laser light source 41C can irradiate the recessed portion 161C of the test unit 16 with the laser light L41 that serves as slit light in the Y direction.

Note that it is possible to use laser light sources that have cylindrical lenses, for example, as the respective laser light sources 41. In this manner, the projection shape of the laser light L41 on the test unit 16 becomes a linear shape. Also, laser light sources that scan spot light in the Y direction, for example, may be used as the respective laser light sources 41 rather than the aforementioned laser light sources.

In addition, it is preferable that the number of laser light sources 41 disposed is equal to or greater than the number of recessed portions 161 arranged in the X direction. Although the number of laser light sources 41 disposed is three in the embodiment, the number is not limited thereto and may be one, two, four, or more, for example.

Although the locations at which the laser light sources 41 (the light irradiation unit 4) are arranged are the obliquely left upper side in the drawing relative to the test unit 16 in the configuration illustrated in FIG. 4, the locations are not limited thereto and may be an obliquely right upper side or both the obliquely left upper side and the obliquely right upper side, for example.

As illustrated in FIG. 4, the imaging unit 5 is disposed and secured above the test unit 16, that is, on the positive side in the Z direction relative to the test unit 16. As illustrated in FIG. 3, the imaging unit 5 includes four cameras 51 in the embodiment. Two of these cameras 51 are disposed in the X direction, the other two are disposed in the Y direction and both have different imaging ranges. It is possible to obtain an image of the entire test unit 16 by synthesizing images captured by the respective cameras 51.

Note that the respective cameras 51 are not particularly limited, and charge-coupled device (CCD) cameras, three-dimensional cameras, or the like can be used, for example.

Although the number of cameras 51 disposed is four in the embodiment, the number is not limited thereto and may be one, two, three, five, or more, for example. Also, the arrangement mode (the number of cameras 51 disposed in the X direction and the number of cameras 51 disposed in the Y direction) of the cameras 51 is not limited to that illustrated in FIG. 3.

Although the respective cameras 51 are secured in the embodiment, the cameras 51 are not limited thereto and may be supported such that the cameras 51 can turn, for example. In this manner, it is possible to change the imaging ranges of the respective cameras 51 or to minimize the total number of cameras 51 disposed.

Processing of detecting remaining of the IC devices 90 in the respective recessed portions 161 of the test unit 16, that is, processing of determining whether or not the IC devices 90 (electronic components) are present is performed by the control unit 800. The control unit 800 that serves as the processing unit has at least one processor, and the processor reads various instructions, determinations, commands, and the like stored in the control unit 800 and performs the various instructions, various determinations, various orders, and the like. The control unit 800 (processor) can perform the remaining detection processing on the basis of at least one of the projection shape and the irradiation position of the laser light L41 projected on the test unit 16 by the test unit 16. Hereinafter, the processing will be described with reference to FIGS. 8 to 11. FIGS. 8 to 11 illustrate one recessed portion 161 as a representative and laser light L41 with which the recessed portion 161 is irradiated.

Figure 8:
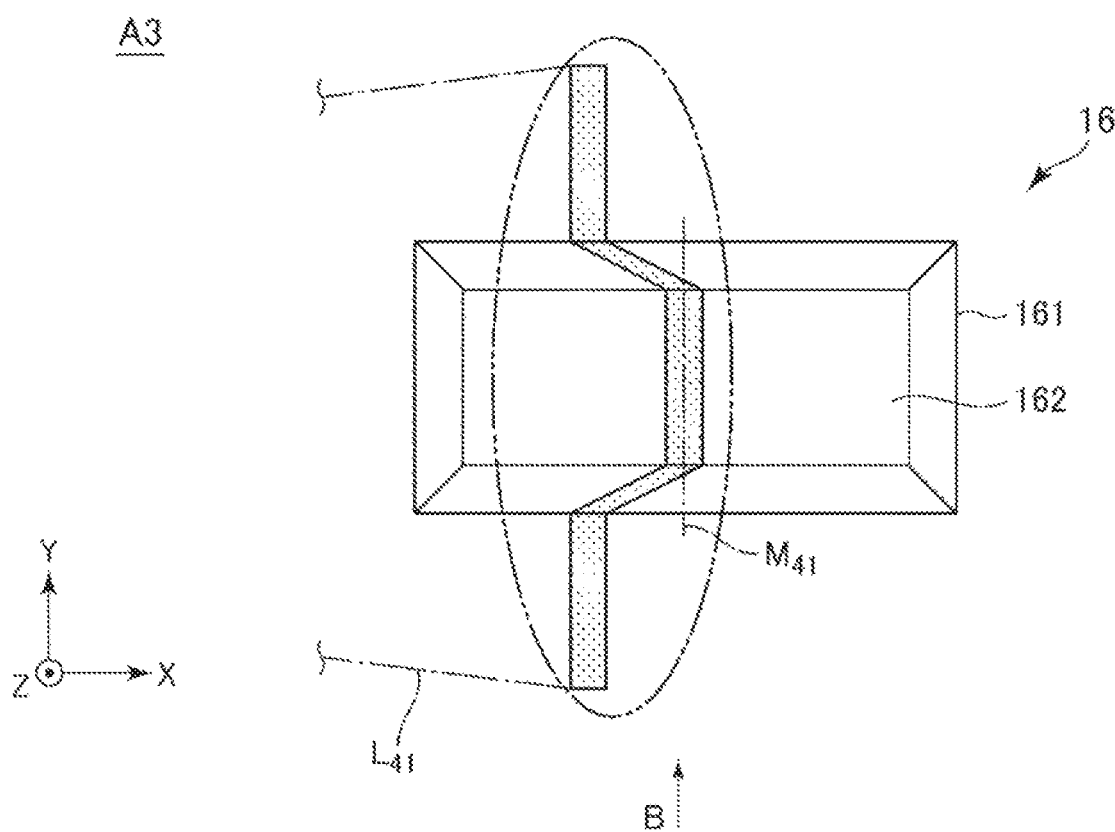
FIG. 8 is a plan view illustrating a state in which an IC device is not placed on a test unit disposed in the test region illustrated in FIG. 3.
Figure 9:
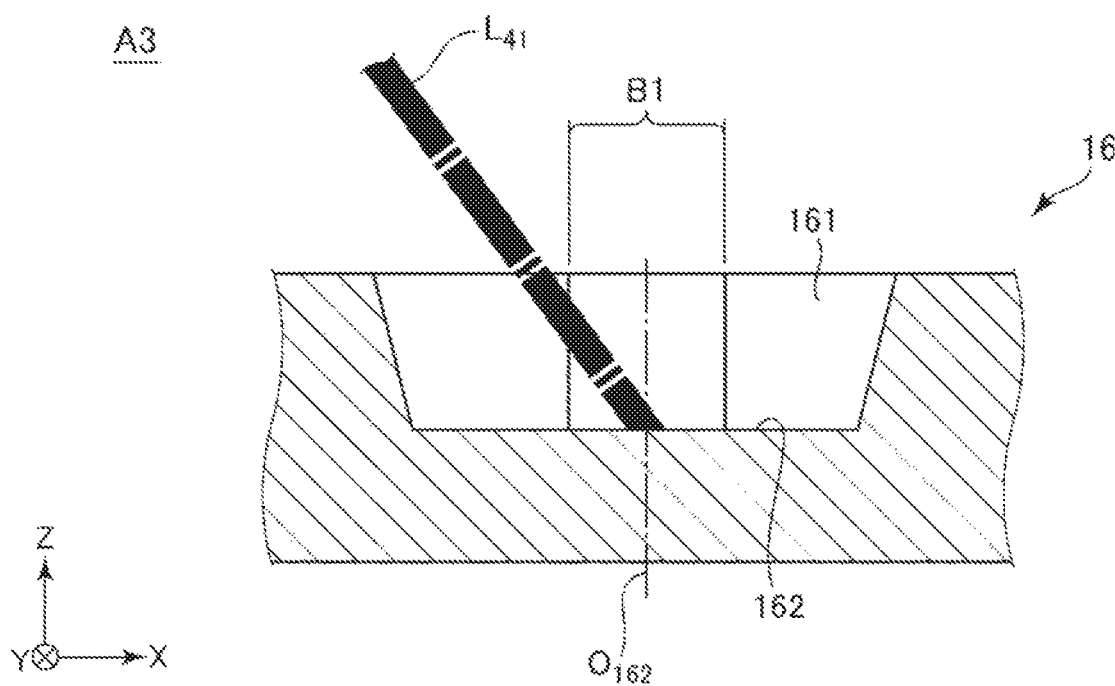
FIG. 9 is a partial sectional view when viewed in the direction of the arrow B in FIG. 8.

In a state in which the IC devices 90 are not placed in the recessed portions 161 as illustrated in FIGS. 8 and 9, the laser light L41 reaches the bottom surfaces 162 of the recessed portions 161. The projection shape of the laser light L41 on the test unit 16 at this time is a linear shape (line shape) that is bent as illustrated in FIG. 8 (see the portion surrounded by the two-dotted chain line in FIG. 8). The projection shape of the laser light L41 illustrated in FIG. 8 is imaged by the imaging unit 5 and is stored in advance in the storage unit of the control unit 800.

Figure 10:
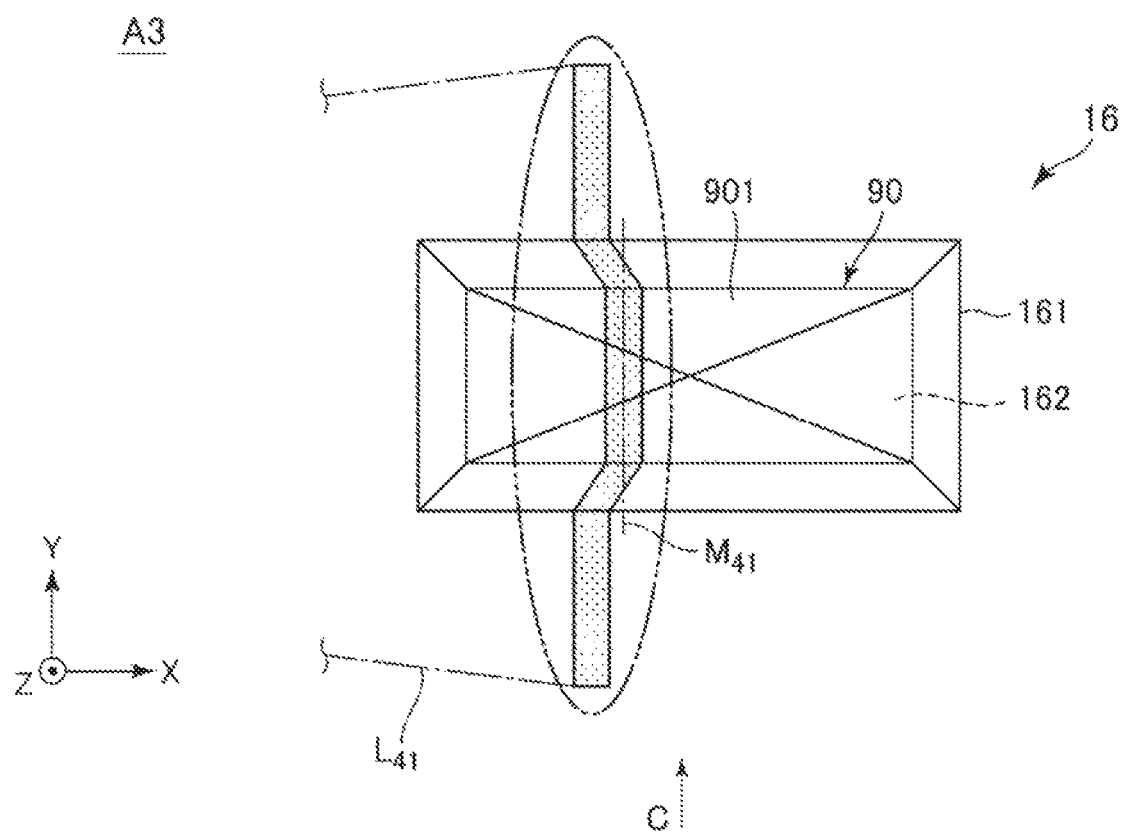
FIG. 10 is a plan view illustrating a state in which the IC device is placed on the test unit disposed in the test region illustrated in FIG. 3.
Figure 11:
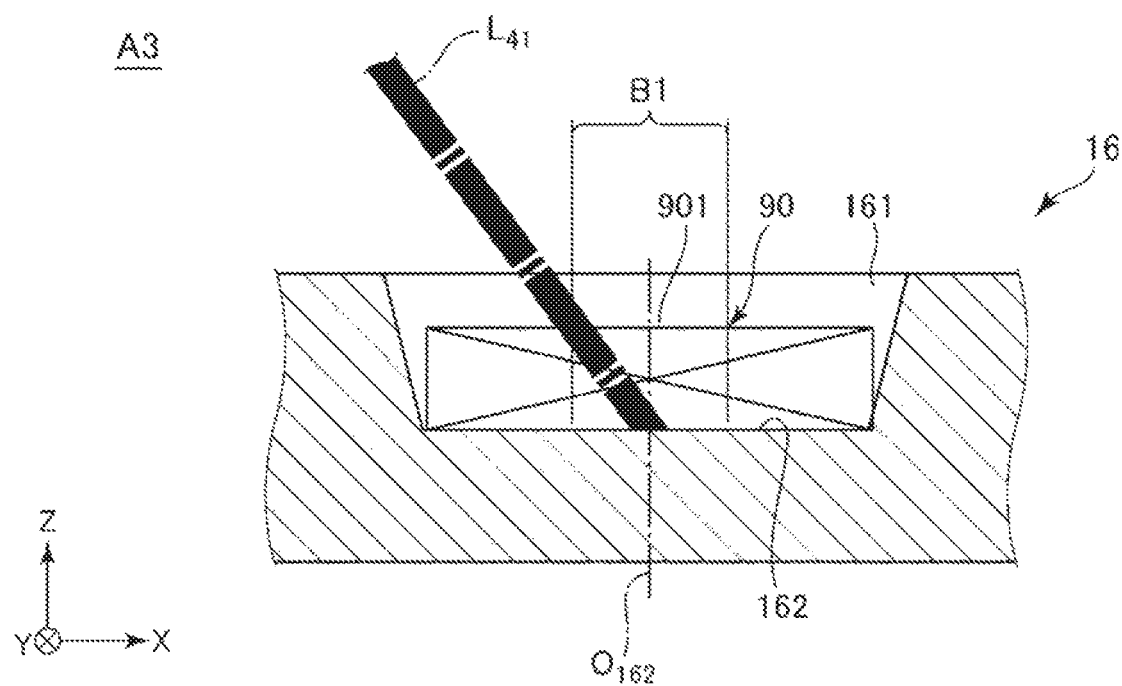
FIG. 11 is a partial sectional view when viewed in the direction of the arrow C in FIG. 10.

Meanwhile, in a state in which the IC devices 90 are placed in the recessed portions 161 as illustrated in FIGS. 10 and 11, the laser light L41 reaches upper surfaces 901 of the IC devices 90 in the recessed portion 161 without reaching the bottom surfaces 162 of the recessed portions 161. The projection shape of the laser light L41 on the test unit 16 at this time is different from the projection shape of the laser light L41 illustrated in FIG. 8 in accordance with placement of the IC devices 90 in the recessed portions 161 and forms a linear shape that is bent as illustrated in FIG. 10 (see the portion surrounded by the two-dotted chain line in FIG. 10). The projection shape of the laser light L41 illustrated in FIG. 10 is imaged as an image by the imaging unit 5 and is stored in advance in the storage unit of the control unit 800.

In a case in which the remaining detection is performed in practice, the recessed portions 161 to which the remaining detection is to be performed is irradiated with the laser light L41, and the projection shape of the laser light L41 is imaged by the imaging unit 5. Then, the projection shape of the laser light L41 projected on the recessed portions 161 on which remaining detection is to be performed is compared to find which of the projection shape of the laser light L41 illustrated in FIG. 8 and the projection shape of the laser light L41 illustrated in FIG. 10 the projection shape is approximated to, and it is then determined whether or not the IC devices 90 remain. Note that although the method of comparing the projection shapes of the laser light L41 as described above is employed as a method of determining whether or not the IC devices 90 remain in the embodiment, the invention is not limited thereto.

As described above, the light irradiation unit 4 has the plurality of laser light sources 41 that serve as light sources and emit the laser light L41 (light) in the remaining detection unit 3. Also, the electronic component tester 1 (electronic component handler 10) has a configuration including the imaging unit 5 that images the test unit 16 (electronic component placement unit 26). With such a configuration, it is possible to irradiate the respective recessed portions 161 of the test unit 16 with the laser light L41 from the respective laser light sources 41. Then, it is possible to image the projection shapes of the laser light L41 projected on the respective recessed portions 161 with the imaging unit 5 and to accurately determine whether or not the IC devices 90 remain in the respective recessed portions 161 in accordance with a result of the image capturing. Note that the light sources are not limited to the laser light sources 41 and may be another type of light sources, such as various lamps or LEDs, for example.

Incidentally, the number or recessed portions 161 arranged, the arrangement mode (pitches between the recessed portions 161 arranged in the X direction or the like), the depth of the recessed portions 161, or the like may differ in the test unit 16 depending on the type of the IC devices 90, for example. In this case, it is necessary to adjust the positions (height) and the postures (angles) of the respective laser light sources 41 of the light irradiation unit 4 (see FIGS. 4 to 7). Hereinafter, the adjustment will be described. Note that the adjustment is performed prior to the processing of detecting remaining of the IC devices 90 performed by the test unit 16 (processing of determining whether or not the IC devices 90 are present). In this manner, it is possible to accurately detect whether or not the IC devices 90 remain in the recessed portions 161 of the test unit 16 even in a case in which the test unit 16 has been replaced in accordance with the type of the IC device 90.

Note that it is preferable that the irradiation positions of the laser light L41 on the test unit 16 are adjusted to fall within regions B1 inside the recessed portions 161 and that it is more preferable that the irradiation positions are adjusted to be at centers O162 of the bottom surfaces 162 of the recessed portions 161 in the X direction, in particular, in the regions B1 (see FIGS. 9 and 11). Although the length of the regions B1 in the X direction is not particularly limited, it is preferable that the length is equal to or greater than 1% and equal to or less than 10%, and it is more preferable that the length is equal to or greater than 5% and equal to or less than 10% of the length of each IC device 90 accommodated in each recessed portion 161 in the X direction.

As described above, the laser light L41 is slit light, and the projection shape thereof is a bent linear shape (see FIGS. 8 and 10). In this case, a center line M41 of the linear shape in the width direction is assumed to be the irradiation position of the laser light L41. In this manner, it is possible to decide the irradiation position irrespective of how wide the slit light is on the test unit 16.

Note that the width of the slit light on the test unit 16 is preferably equal to or greater than 0.3 mm and equal to or less than 1 mm and is more preferably equal to or greater than 0.3 mm and equal to or less than 0.5 mm.

A method of detecting the center line M41 is not particularly limited, and for example, a method of detecting (measuring) luminance distribution of the slit light on the test unit 16 and setting a portion with the highest luminance as the center line M41 is exemplified.

Although the center line M41 in the width direction of the line shape is set as the irradiation position of the laser light L41, the invention is not limited thereto. In a case in which the size of the recessed portions 161 in a plan view is sufficiently large relative to the width of the linear shape, for example, the entire linear shape in the width direction may be set as the irradiation position of the laser light L41.

As illustrated in FIGS. 3 to 7, the remaining detection unit 3 (electronic component handler 10) includes the vertical direction moving mechanism unit 6 that movably supports the respective laser light sources 41 of the light irradiation unit 4 such that the laser light sources 41 can move in the Z direction (vertical direction) and a turning mechanism unit 7 that supports the respective laser light sources 41 such that the laser light sources 41 can turn about a turning axis O41 in parallel with the Y axis.

Figure 12:
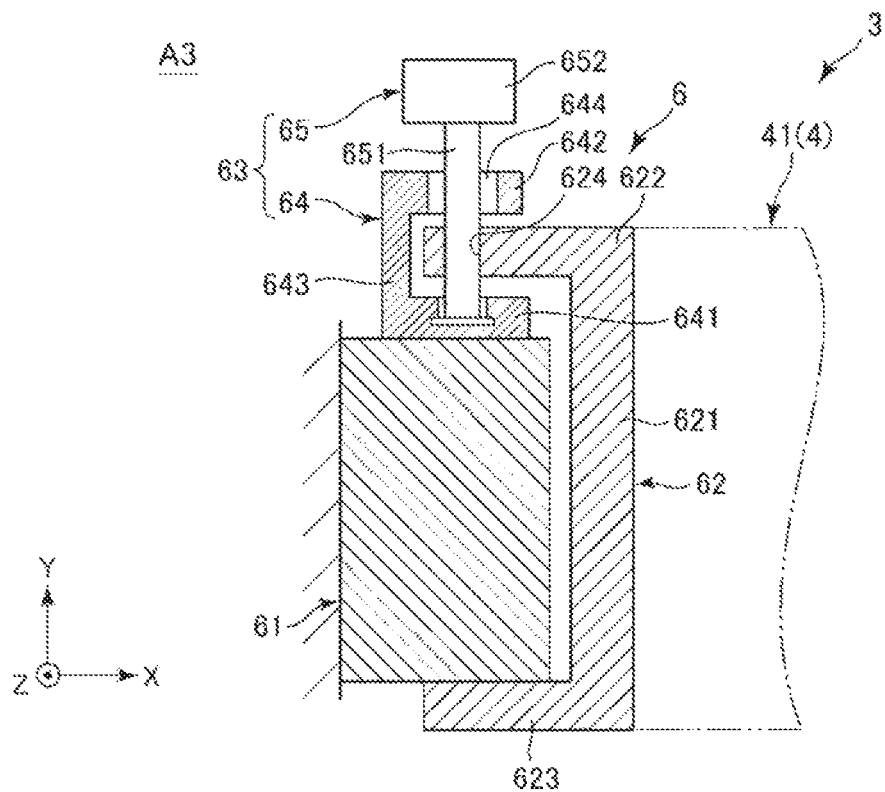
FIG. 12 is a partial cross-sectional view illustrating a structure of a vertical direction moving mechanism unit included in the electronic component tester illustrated in FIG. 1.
Figure 13:
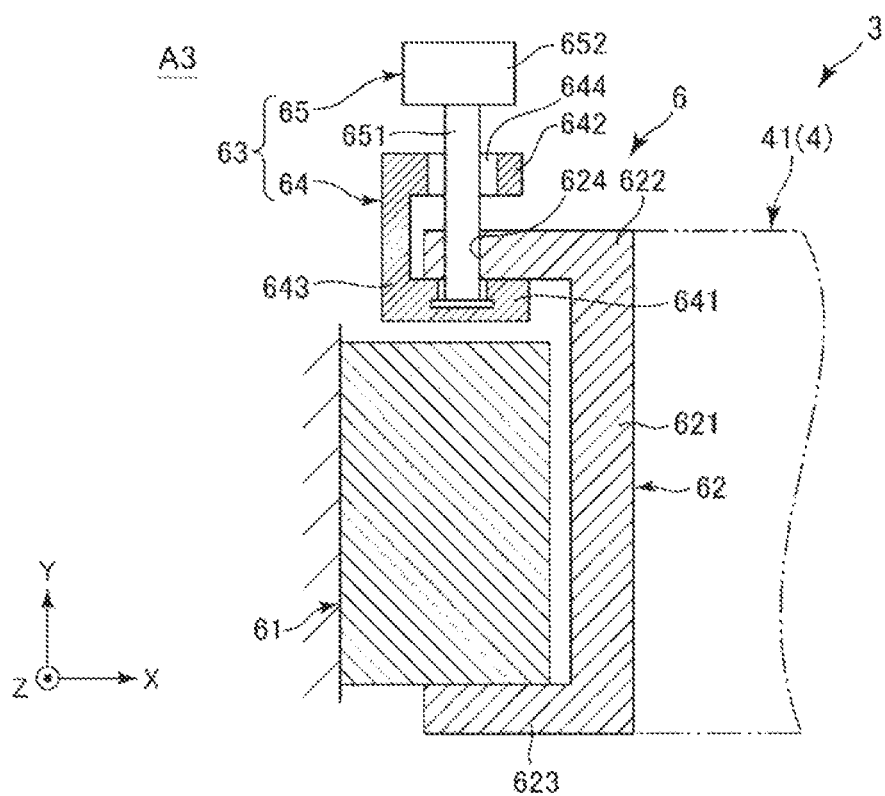
FIG. 13 is a partial cross-sectional view illustrating a structure of the vertical direction moving mechanism included in the electronic component tester illustrated in FIG. 1.

As illustrated in FIGS. 12 and 13, the vertical direction moving mechanism unit 6 has a guide rail 61 that serve as a guide, that guides the respective laser light sources 41 of the light irradiation unit 4 in the Z direction (vertical direction), sliders 62 that serve as a first support unit, a second support unit, and the like, support the respective laser light sources 41, and slide on the guide rail 61, and a movement adjustment unit 63 that restricts sliding of the respective sliders 62 and adjusts the positions thereof. The guide may be a groove that guides the respective laser light sources 41 of the light irradiation unit 4 in the Z direction. Further, the guide may be a screw shaft of a ball screw.

The guide rail 61 is disposed in parallel with the Z direction. The guide rail 61 is secured to the second barrier wall 232, for example, in the test region A3 by a securing method such as a method using screwing. By providing such a guide rail 61, it is possible to cause the respective sliders 62 to smoothly slide along the guide rail 61, and it is thus possible to accurately perform adjustment of the positions of the laser light sources 41, which are supported by the respective sliders 62, in the Z direction, that is, adjustment of the height H41A of the laser light source 41A from the bottom surface 162 of the recessed portion 161, adjustment of the height H41B of the laser light source 41B, and adjustment of the height H41C of the laser light source 41C. Note that the guide rail 61 may be provided in an inclined manner relative to the Z direction.

As illustrated in FIGS. 12 and 13, the sliders 62 are arranged on the positive side of the guide rail 61 in the X direction. Note that the sliders 62 are prevented from coming off from the guide rail 61. Each slider 62 is formed of a block body that has a first site 621 that faces the positive side in the X direction, a second site 622 that faces the positive side in the Y direction, and a third site 623 that faces the negative side in the Y direction. The laser light sources 41 are supported at the first site 621 of the slider 62. In this manner, it is possible to cause the slider 62 to slide in the upper-lower direction along the guide rail 61 for each laser light source 41. It is possible to adjust the positions of the respective laser light sources 41 in the Z direction in a stepless manner through the sliding. Note that although the positions of the respective laser light sources 41 in the Z direction can be adjusted in the stepless manner, the invention is not limited thereto, and the positions may be able to be adjusted in multiple steps.

As illustrated in FIGS. 4 to 7, the laser light sources 41 are supported by the sliders 62 one by one. In this manner, the vertical direction moving mechanism unit 6 is configured to independently movably support the respective laser light sources 41. With such a configuration, it is possible to independently perform the adjustment of the height H41A of the laser light source 41A, the adjustment of the height H41B of the laser light source 41B, and the adjustment of the height H41C of the laser light source 41C. In this manner, it is possible to irradiate the target recessed portion 161A with the laser light L41 emitted from the laser light source 41A. Similarly, it is possible to irradiate the target recessed portion 161B with the laser light L41 emitted from the laser light source 41B. Also, it is possible to irradiate the target recessed portion 161C with the laser light L41 emitted from the laser light source 41C.

The vertical direction moving mechanism unit 6 has the movement adjustment unit 63 that adjust the positions of the respective laser light sources 41 (the light irradiation unit 4) at the destinations of movement when movement of the respective laser light sources 41 of the light irradiation unit 4 in the upper-lower direction stops. In this manner, the respective laser light source 41 can maintain constant irradiation positions relative to the test unit 16. That is, the laser light source 41A can continue to irradiate the recessed portion 161A with the laser light L41. Similarly, the laser light source 41B can continue to irradiate the recessed portion 161B with the laser light L41. The laser light source 41C can continue to irradiate the recessed portion 161C with the laser light L41.

As illustrated in FIGS. 12 and 13, the movement adjustment unit 63 has a stopper 64 that can approach and separate from the guide rail 61 and a knurled screw 65 that serves as an operation unit for performing approaching and separating operations of the stopper 64.

The stopper 64 has an inner portion (brake portion) 641 that is inserted between the guide rail 61 and the second site 622 of each slider 62, an outer portion 642 that is disposed on the side opposite to the inner portion 641 via the second site 622, and a coupling portion 643 that couples the inner portion 641 to the outer portion 642.

The knurled screw 65 has a male screw portion 651 that is supported at the inner portion 641 of the stopper 64 such that the male screw portion 651 can turn and a pinching portion 652 that serves as a screw head. The male screw portion 651 is fit into a female screw portion 624 formed at the second site 622 of each slider 62. Also, the male screw portion 651 penetrates through a through-hole 644 formed at the outer portion 642 of the stopper 64.

It is possible to fasten the knurled screw 65 toward the guide rail 61 by pinching the pinching portion 652 of the knurled screw 65 with finger tips and performing a rotation direction directly in a predetermined direction. In this manner, it is possible to press the inner portion 641 of the stopper 64 against the guide rail 61 and thereby to achieve the state illustrated in FIG. 12. In the state illustrated in FIG. 12, positional deviation of the laser light sources 41 is prevented, that is, it is possible to adjust the positions of the laser light sources 41.

It is possible to loosen the knurled screw 65 by performing a rotating operation on the knurled screw 65 in the direction opposite to the aforementioned direction from the state illustrated in FIG. 12. In this manner, it is possible to cause the inner portion 641 of the stopper 64 to separate from the guide rail 61 and thereby to achieve the state illustrated in FIG. 13. In the state illustrated in FIG. 13, positional restriction of the laser light sources 41 is released. In this manner, it is possible to adjust the positions (adjust the heights) of the laser light sources 41 by causing each slider 62 to slide along the guide rail 61 for each laser light source 41.

Note that the movement adjustment unit 63 is not limited to the one with the configuration illustrated in FIGS. 12 and 13.

Although the positions of the laser light sources 41 is manually adjusted in the embodiment, the invention is not limited thereto, and the position adjustment may be automated by supplying electric power, for example.

As described above, the remaining detection unit 3 (electronic component handler 10) includes the turning mechanism unit 7 that supports the respective laser light sources 41 of the light irradiation unit 4 such that the laser light sources 41 can turn about the turning axis O41 in parallel with the Y axis. In this manner, it is possible to smoothly perform adjustment of the postures of the laser light sources 41 relative to the Z direction (the inclination angle of the optical axis of the laser light L41), that is, a turning angle θ41A of the laser light source 41A, adjustment of a turning angle θ41B of the laser light source 41B, and adjustment of a turning angle θ41C of the laser light source 41C. Thus, it is possible to accurately irradiate the recessed portions 161 as irradiation targets with the laser light L41 in conjunction with the adjustment of the heights of the laser light sources 41.

As described above, the light irradiation unit 4 has the plurality of laser light sources 41 that emit the laser light L41. As illustrated in FIGS. 4 to 7, the turning mechanism unit 7 supports the laser light sources 41 one by one such that the laser light sources 41 can turn. In this manner, the turning mechanism unit 7 is configured to support the respective laser light sources 41 such that the laser light sources 41 can independently turn. With such a configuration, it is possible to independently perform the adjustment of the turning angle θ41A of the laser light source 41A, the adjustment of the turning angle θ41B of the laser light source 41B, and the adjustment of the turning angle θ41C of the laser light source 41C. In this manner, it is possible to irradiate the target recessed portion 161A with the laser light L41 emitted from the laser light source 41A. Similarly, it is possible to irradiate the target recessed portion 161B with the laser light L41 emitted from the laser light source 41B. Also, it is possible to irradiate the target recessed portion 161C with the laser light L41 emitted from the laser light source 41C.

Figure 14:
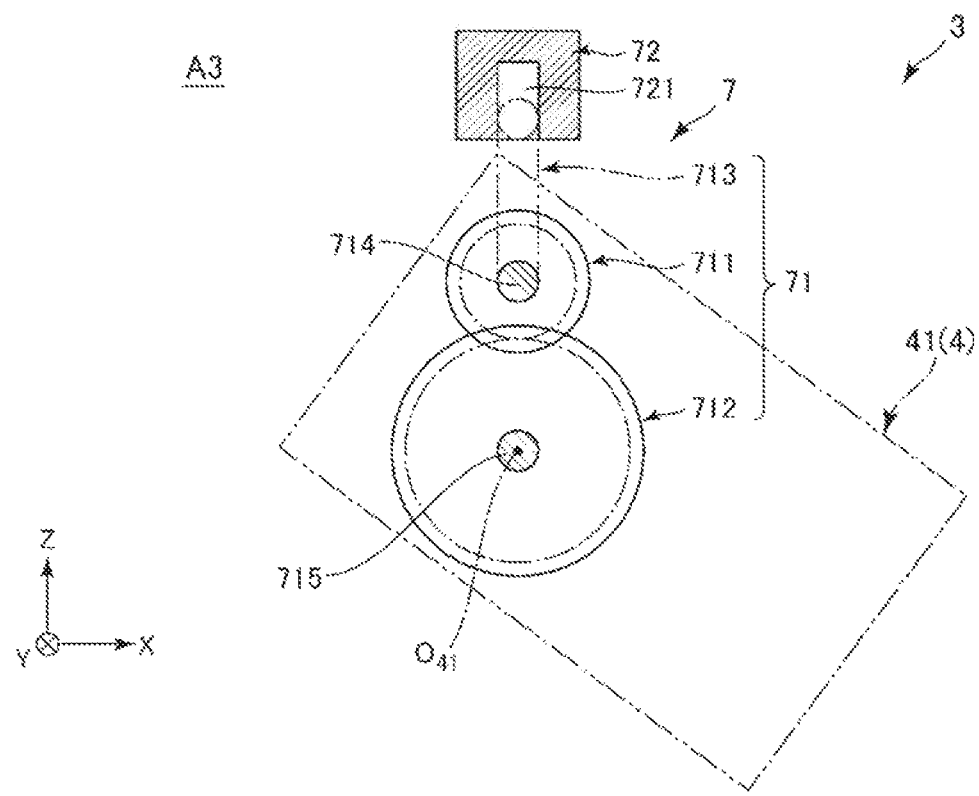
FIG. 14 is a partial vertical sectional view illustrating a structure of a turning mechanism unit included in the electronic component tester illustrated in FIG. 1.
Figure 15:
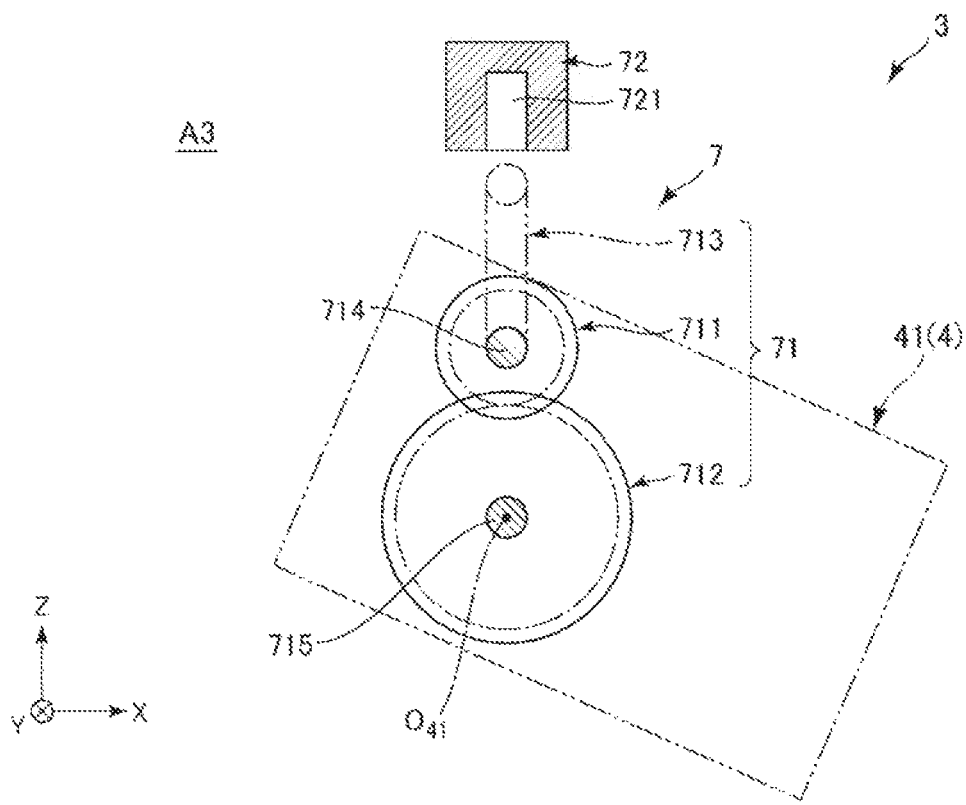
FIG. 15 is a partial vertical sectional view illustrating a structure of the turning mechanism unit included in the electronic component tester illustrated in FIG. 1.

As illustrated in FIGS. 14 and 15, the turning mechanism unit 7 has a decelerator 71 that decelerates angular speeds of the respective laser light sources 41 of the light irradiation unit 4. The decelerator 71 includes a first gear 711, a second gear 712 that is meshed with the first gear 711, and a lever 713 that is detachable with respect to the first gear 711.

The first gear 711 is formed of a spur gear. The lever 713 can be detachably attached to a shaft member 714 that rotatably supports the first gear 711. It is possible to rotate the first gear 711 in the same direction by performing a rotating operation on the lever 713 in the same direction in this attached state.

The second gear 712 is also formed of a spur gear, and the diameter thereof is greater than the diameter of the first gear 711. Note that a deceleration ratio between the first gear 711 and the second gear 712 is arbitrary and is not particularly limited. The shaft member 715 that rotatably supports the second gear 712 is consistent with the turning axis O41 of the laser light source 41.

With the turning mechanism unit 7 with such a configuration, it is possible to respectively perform fine adjustment of the turning angle θ41A of the laser light source 41A, fine adjustment of the turning angle θ41B of the laser light source 41B, and fine adjustment of the turning angle θ41C of the laser light source 41C.

Note that the decelerator 71 is not limited to the one with the configuration illustrated in FIGS. 14 and 15.

The turning mechanism unit 7 has the turning adjustment unit 72 that adjusts the positions of the respective laser light sources 41 (light irradiation unit 4) at destinations of turning when the turning of the respective laser light sources 41 of the light irradiation unit 4 is stopped. In this manner, the respective laser light sources 41 can maintain constant irradiation positions relative to the test unit 16 along with the movement adjustment unit 63 of the vertical direction moving mechanism unit 6.

As illustrated in FIGS. 14 and 15, the turning adjustment unit 72 is formed of a member that moves in the Z direction and is supported such that the turning adjustment unit 72 can approach and separate from the lever 713. The turning adjustment unit 72 has a groove (recessed portion) 721 formed in a lower surface thereof.

As illustrated in FIG. 14, the lever 713 is inserted into and engaged with the groove 721 in a state in which the turning adjustment unit 72 has approached the lever 713. In this manner, it is possible to maintain the postures of the laser light sources 41 by restricting turning of the laser light sources 41 along with the lever 713.

The state illustrated in FIG. 15, that is, the state in which the turning adjustment unit 72 has separated from the lever 713 is achieved by moving the turning adjustment unit 72 upward from the state illustrated in FIG. 14. In the state illustrated in FIG. 15, the lever 713 has been pulled out of the groove 721, and the engagement between the lever 713 and the groove 721 has been released. In this manner, it is possible to perform a rotating operation on the lever 713 and thereby to adjust the postures of the laser light sources 41. Also, it is possible to cause the lever 713 to be engaged with the groove 721 of the turning adjustment unit 72 again after the adjustment. In this manner, it is possible to maintain the postures of the laser light sources 41.

Note that in a case in which the lever 713 has not achieved the state illustrated in FIGS. 14 and 15, that is, the state in which the lever 713 projects toward the turning adjustment unit 72 (upper side), and in a case in which it is difficult to establish engagement with the turning adjustment unit 72, it is possible to cause the lever 713 to come off from the shaft member 714 of the first gear 711 once and to obtain the state in which it is possible to attach the lever 713 to the shaft member 714 again as the state in which it is possible to establish engagement with the turning adjustment unit 72, and to as illustrated in FIGS. 14 and 15.

Although the postures of the laser light sources 41 are manually adjusted in the embodiment, the invention is not limited thereto, and the posture adjustment may be automated by supplying electric power, for example.

As described above, the pitches between the recessed portions 161 arranged in the X direction, the depth of the recessed portions 161, and the like of the test unit 16 may differ depending on the type of the IC devices 90, for example. In this case, the position adjustment of the respective laser light sources 41 in the Z direction and the posture adjustment about the turning axis O41 are performed, thereby accurately irradiating the respective recessed portions 161 with the laser light L41.

Hereinafter, the adjustment will be described with reference to FIGS. 4 to 7. Here, the test unit 16 in FIG. 4 will be referred to as an "test unit 16A", the test unit 16 in FIG. 5 will be referred to as an "test unit 16B, the test unit 16 in FIG. 6 will be referred to as an "test unit 16C", and the test unit 16 in FIG. 7 will be referred to as an "test unit 16D". A case in which the test unit 16A is replaced with the test unit 16B (hereinafter, referred to as "first replacement") and a case in which the test unit 16A is replaced with the test unit 16C (hereinafter, referred to as "second replacement"), and a case in which the test unit 16C is replaced with the test unit 16D (hereinafter, referred to as "third replacement") will be respectively described as examples.

First, the first replacement will be described with reference to FIGS. 4 and 5.

The pitches between the recessed portions 161 of the test unit 16A in the X direction are the same as the pitches of the recessed portions 161 of the test unit 16B in the X direction. The depths of the respective recessed portions 161 of the test unit 16A are different from the depths of the respective recessed portions 161 of the test unit 16B, and the depths of the respective recessed portions 161 of the test unit 16B are shallower than the depths of the respective recessed portions 161 of the test unit 16A. In a case in which the depths of the recessed portions 161 are shallow, it is preferable to lower the respective heights of the laser light source 41A, the laser light source 41B, and the laser light sources 41C. This is because a state in which the projection shape is bent (see FIG. 8) significantly appears when the laser light L41 is projected from the respective laser light sources 41 to the test unit 16B.

In the state illustrated in FIG. 4, the recessed portion 161A is irradiated with the laser light L41 from the laser light source 41A, the recessed portion 161B is irradiated with the laser light L41 from the laser light source 41B, and the recessed portion 161C is irradiated with the laser light L41 from the laser light source 41C.

Then, the test unit 16A is replaced with the test unit 16B from the state illustrated in FIG. 4.

Figure 5:
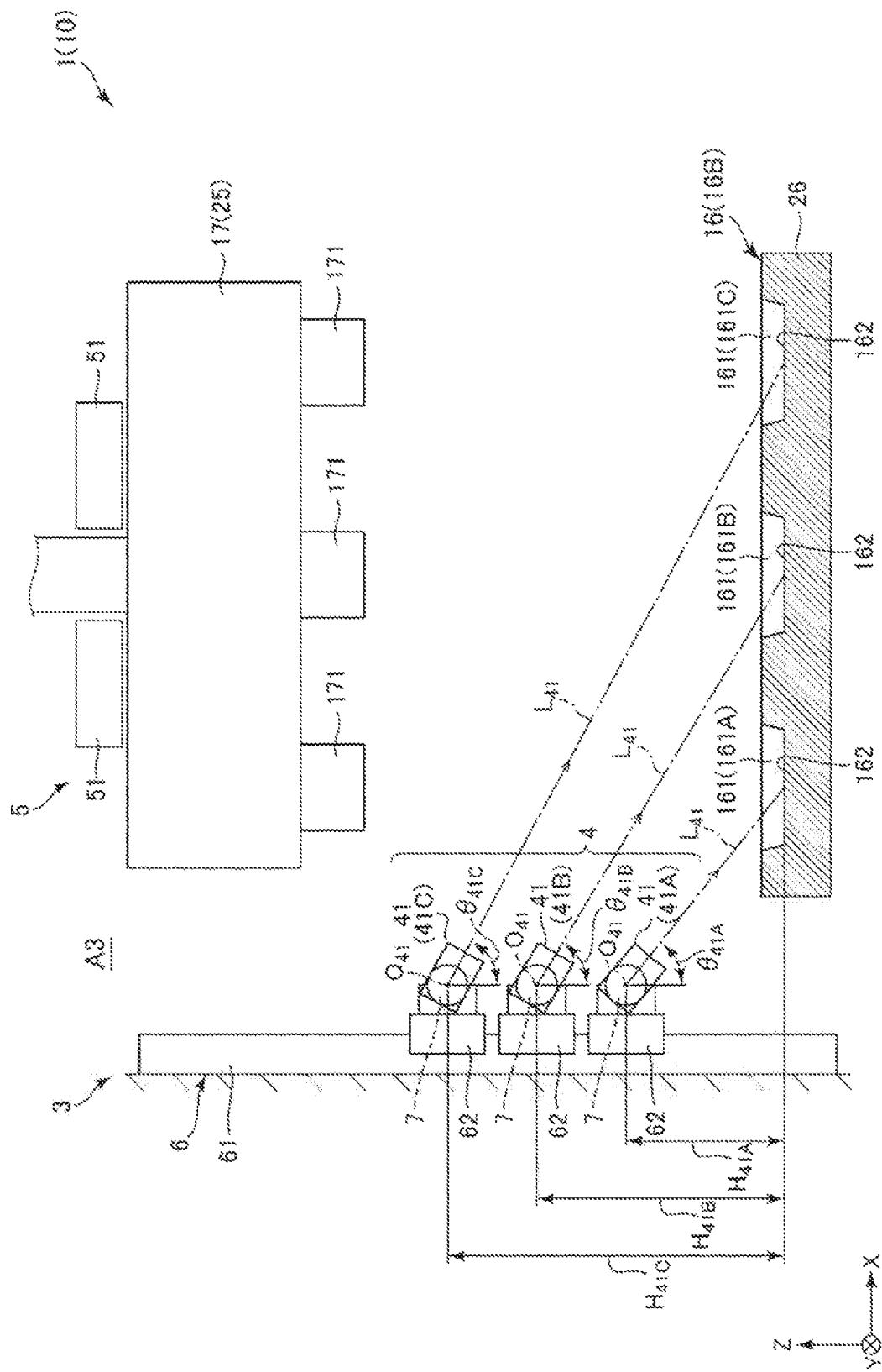
FIG. 5 is a partial sectional view (example) when viewed in the direction of the arrow A in FIG. 3.

Then, the vertical direction moving mechanism unit 6 is operated as described above, the laser light source 41A, the laser light source 41B, and the laser light source 41C are respectively lowered as illustrated in FIG. 5, thereby performing adjustment of the height H41A of the laser light source 41A, adjustment of the height H41B of the laser light source 41B, and adjustment of the height H41C of the laser light source 41C. Note that the pitch (interval) between the laser light source 41A and the laser light source 41B in the Z direction and the pitch (interval) between the laser light source 41B and the laser light source 41C in the Z direction are maintained to be constant even if the state illustrated in FIG. 4 is changed to the state illustrated in FIG. 5.

As described above, the turning mechanism unit 7 is operated, thereby performing adjustment of the turning angle θ41A of the laser light source 41A, adjustment of the turning angle θ41B of the laser light source 41B, and adjustment of the turning angle θ41C of the laser light source 41C as illustrated in FIG. 5.

Through such adjustment, the recessed portion 161A of the test unit 16B can be irradiated with the laser light L41 from the laser light source 41A, the recessed portion 161B can be irradiated with the laser light L41 from the laser light source 41B, and the recessed portion 161C can be irradiated with the laser light L41 from the laser light source 41C even after the replacement of the test unit 16A with the test unit 16B.

Next, the second replacement will be described with reference to FIGS. 4 and 6.

The pitches between the recessed portions 161 of the test unit 16A in the X direction are the same as the pitches between the recessed portions 161 of the test unit 16C in the X direction. Also, the depths of the respective recessed portions 161 of the test unit 16A are different from the depths of the respective recessed portions 161 of the test unit 16C, and the depths of the respective recessed portions 161 of the test unit 16C are shallower than the depths of the respective recessed portions 161 of the test unit 16A.

The state illustrated in FIG. 4 is as described above in regard to the first replacement.

Then, the test unit 16A is replaced with the test unit 16C from the state illustrated in FIG. 4.

Figure 6:
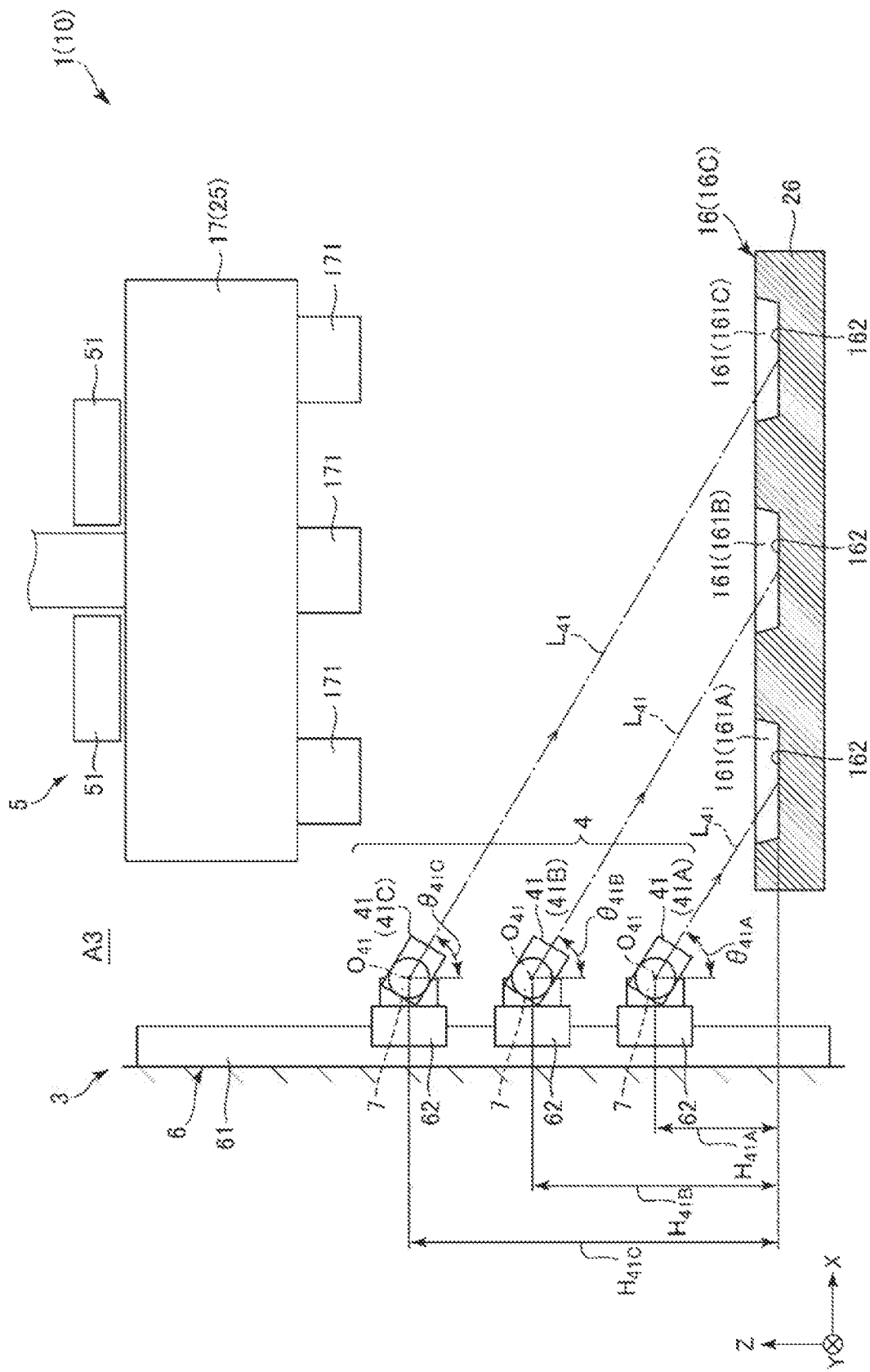
FIG. 6 is a partial sectional view (example) when viewed in the direction of the arrow A in FIG. 3.

Then, the vertical direction moving mechanism unit 6 is operated as described above, and the laser light source 41A, the laser light source 41B, and the laser light source 41C are respectively lowered as illustrated in FIG. 6, thereby performing adjustment of the height H41A of the laser light source 41A, adjustment of the height H41B of the laser light source 41B, and adjustment of the height H41C of the laser light source 41C.

Also, the turning mechanism unit 7 is operated as described above, thereby performing adjustment of the turning angle θ41A of the laser light source 41A, adjustment of the turning angle θ41B of the laser light source 41B, and adjustment of the turning angle θ41C of the laser light source 41C as illustrated in FIG. 6. Through the adjustment, it is possible to set the turning angle θ41A, the turning angle θ41B, and the turning angle θ41C to be the same size. Therefore, such adjustment is effective in a case in which it is desirable to achieve a condition of "the turning angle θ41A=the turning angle θ41B=the turning angle θ41C".

Through such adjustment, the recessed portion 161A of the test unit 16C can be irradiated with the laser light L41 from the laser light source 41A, the recessed portion 161B can be irradiated with the laser light L41 from the laser light source 41B, and the recessed portion 161C can be irradiated with the laser light L41 from the laser light source 41C even after the replacement of the test unit 16A with the test unit 16C.

Next, the third replacement will be described with reference to FIGS. 6 and 7.

The pitches between the recessed portions 161 of the test unit 16C in the X direction are different from the pitches between the recessed portions 161 of the test unit 16D in the X direction, and the pitches of the recessed portions 161 of the test unit 16D in the X direction are shallower than the pitches between the recessed portions 161 of the test unit 16C in the X direction. Note that the position of the recessed portion 161B of the test unit 16C in the X direction is the same as the position of the recessed portion 161B of the test unit 16D in the X direction. Also, the depths of the respective recessed portions 161 of the test unit 16C are the same as the depths of the respective recessed portions 161 of the test unit 16D.

The state illustrated in FIG. 6 is as described above in regard to the second replacement.

Then, the test unit 16C is replaced with the test unit 16D from the state illustrated in FIG. 6.

Figure 7:
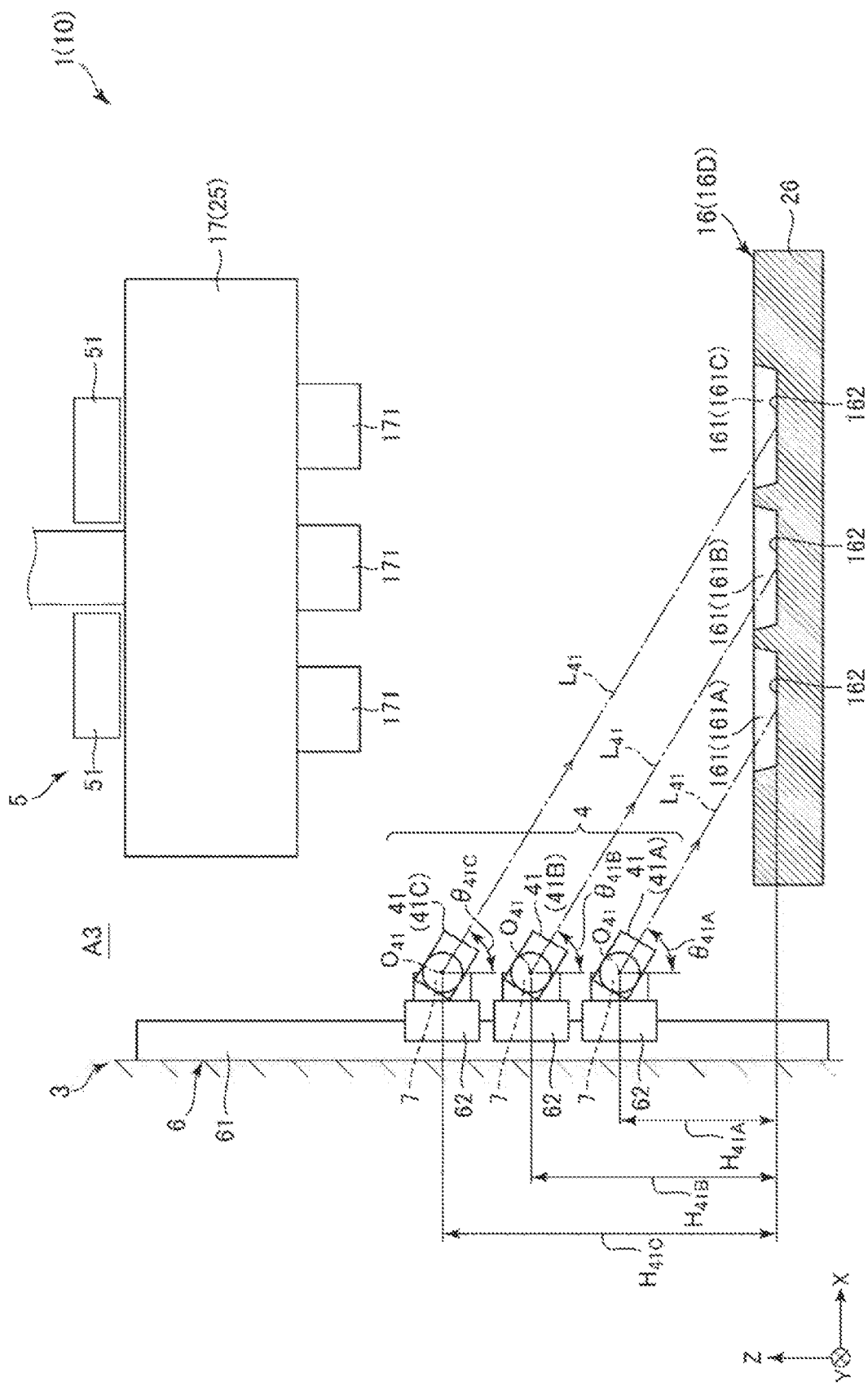
FIG. 7 is a partial sectional view (example) when viewed in the direction of the arrow A in FIG. 3.

Then, the vertical direction moving mechanism unit 6 is operated as described above, and the laser light source 41A is lifted while the turning angle θ41A of the laser light source 41A is maintained to be constant as illustrated in FIG. 7, thereby performing adjustment of the height H41A of the laser light source 41A. Similarly, the laser light source 41C is lowered while the turning angle θ41C of the laser light source 41C is maintained to be constant, thereby performing adjustment of the height H41A of the laser light source 41A and adjustment of the height H41C of the laser light source 41C.

Since the position of the recessed portion 161B of the test unit 16C in the X direction is the same as the position of the recessed portion 161B of the test unit 16D in the X direction, adjustment of the height H41B of the laser light source 41B can be omitted.

Through such adjustment, the recessed portion 161 A of the test unit 16D can be irradiated with the laser light L41 from the laser light source 41A, the recessed portion 161B can be irradiated with the laser light L41 from the laser light source 41B, and the recessed portion 161C can be irradiated with the laser light L41 from the laser light source 41C even after the replacement of the test unit 16C with the test unit 16D.

As described above, it is possible to appropriately adjust the positions of the respective laser light sources 41 in the Z direction and the postures thereof about the turning axis O41 according to the electronic component tester 1 (electronic component handler 10) even if the positions of the recessed portions 161 of the test unit 16 are changed. In this manner, it is possible to accurately irradiate the target recessed portions 161 with the laser light L41 emitted from the respective laser light sources 41 irrespective of the positions of the recessed portions 161. Then it is possible to accurately detect remaining of the IC devices 90 in the recessed portions 161 on the basis of the projection shape of the laser light L41 on the recessed portions 161.

Second Embodiment

Hereinafter, although an electronic component handler and an electronic component tester according to a second embodiment of the invention will be described with reference to FIG. 16, differences from the aforementioned embodiment will be mainly described, and description of similar matters will be omitted.

The embodiment is similar to the first embodiment other than that the positions of the recessed portions that are targets of laser light sources are different.

Figure 16:
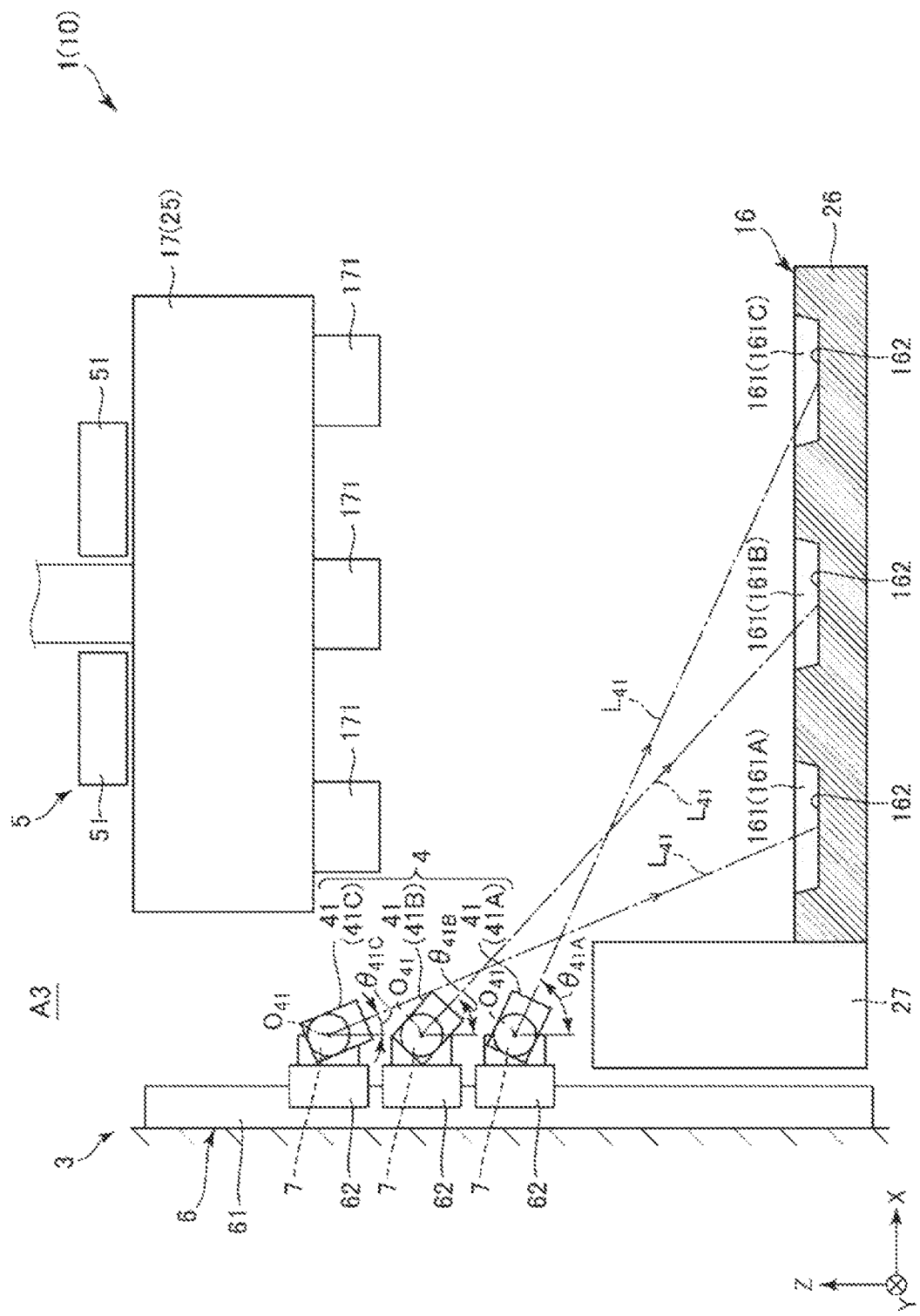
FIG. 16 is a partial sectional view of the inside of a test region of an electronic component tester (second embodiment) according to the invention when viewed from the front side.

As illustrated in FIG. 16, the respective laser light sources 41 are disposed in the Z direction (vertical direction). These laser light sources 41 are used such that angles of the laser light sources 41 in the Z direction (vertical direction) decrease as the laser light sources 41 are located further upward. That is, the turning angle θ41C of the laser light source 41C located on the uppermost side is the smallest, the turning angle θ41A of the laser light source 41A located on the lowermost side is the largest, and the turning angle θ41B of the laser light source 41B located between the laser light source 41A and the laser light source 41C is the angle with the intermediate size.

In a case in which the recessed portion 161A is irradiated with the laser light L41 from the laser light source 41A, there is a concern that the laser light L41 is interrupted by a cover member 27 that covers a predetermined mechanism, for example, and does not reach the recessed portion 161A. In this case, the recessed portion 161C can be irradiated with the laser light L41 from the laser light source 41A, the recessed portion 161B can be irradiated with the laser light L41 from the laser light source 41B, and the recessed portion 161A can be irradiated with the laser light L41 from the laser light source 41C as illustrated in FIG. 16 by employing the aforementioned use mode. In this manner, it is possible to accurately detect remaining of the IC devices 90 in the respective recessed portions 161 on the basis of the projection shapes of the laser light L41 on the respective recessed portions 161. Also, it is possible to freely design layout of the respective members in the test region A3.

Third Embodiment

Although an electronic component handler and an electronic component tester according to a third embodiment of the invention will be described below with reference to FIG. 17, differences from the aforementioned embodiments will be mainly described, and description of similar matters will be omitted.

The embodiment is similar to the aforementioned first embodiment other than that the configuration of the vertical direction moving mechanism unit is different.

Figure 17:
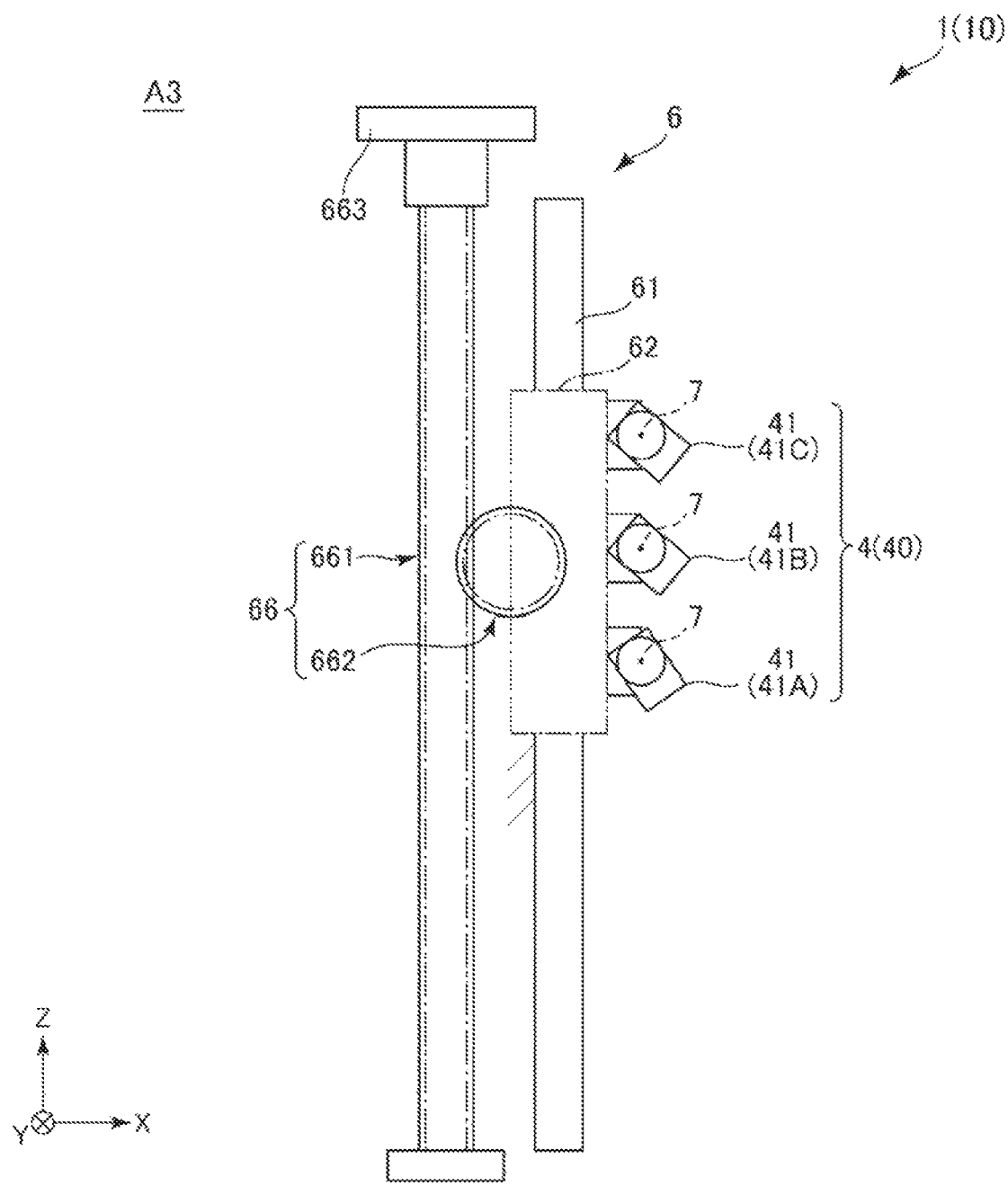
FIG. 17 is a view of the inside of an electronic component tester (third embodiment) according to the invention when viewed from the front side.

As illustrated in FIG. 17, the vertical direction moving mechanism unit 6 has one slider 62 that serves as a support unit. Then, the light irradiation unit 4 forms the light source unit 40 in which a plurality of (three in the embodiment) laser light sources 41 are integrated as a unit and is supported by the slider 62. That is, the slider 62 that serves as the support unit supports the plurality of laser light sources 41. In this manner, the vertical direction moving mechanism unit 6 is configured to collectively support the respective laser light sources 41, that is, to support the respective laser light sources 41 with the entire light source unit 40 such that the laser light sources 41 can move in the same direction. With such a configuration, it may become easier to adjust the heights of the respective laser light sources 41 depending on the type of the test unit 16 disposed in the test region A3, for example.

The vertical direction moving mechanism unit 6 has a decelerator 66 that decelerates the moving speed of the light source unit 40 (light irradiation unit 4). The decelerator 66 has a cylindrical worm 661 that is disposed in parallel with the Z direction and has both ends supported such that the cylindrical worm 661 can turn and a cylindrical worm wheel 662 that is supported by the slider 62 such that the cylindrical worm wheel 662 can turn and is meshed with the cylindrical worm 661. Note that the deceleration ratio between the cylindrical worm 661 and the cylindrical worm wheel 662 is arbitrary and is not particularly limited.

A lever 663 is provided above the cylindrical worm 661. The cylindrical worm 661 rotates in the same direction by performing a rotating operation on the lever 663 in the same direction. The rotation force is delivered to the cylindrical worm wheel 662, and the cylindrical worm wheel 662 rotates by the amount of deceleration. In this manner, the light source unit 40 is lifted or lowered. With the decelerator 66 with such a configuration, it is possible to finely adjust the height of the light source unit 40. It is possible to easily adjust the positions and the like of the laser light sources 41 by the positions at which the IC devices 90 are placed being irradiated with the slit light (laser light L41) from the laser light sources 41.

Note that the decelerator 66 is not limited to one with the configuration illustrated in FIG. 17.

Fourth Embodiment

Figure 18:
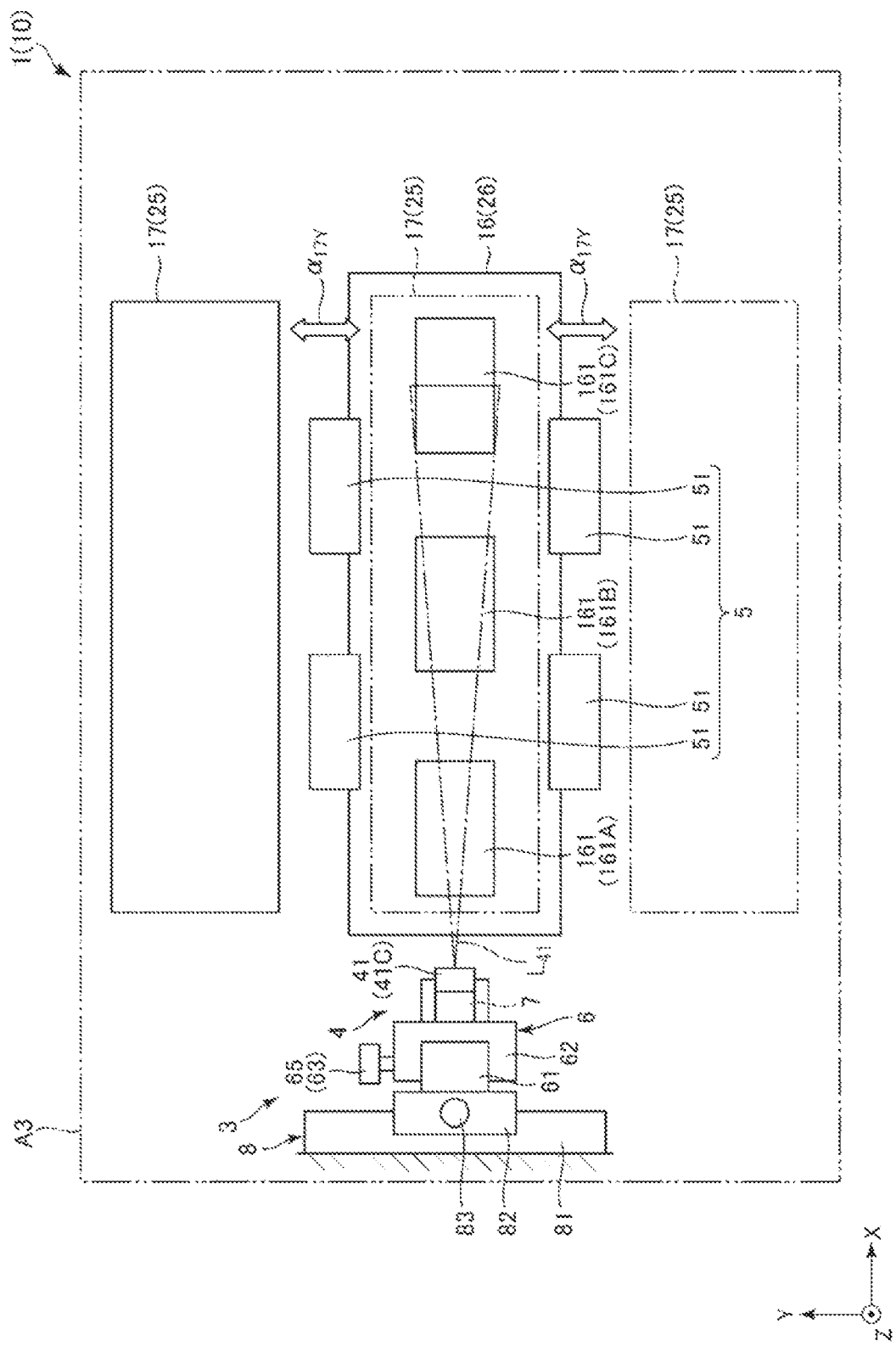
FIG. 18 is an enlarged plan view in a test region of an electronic component tester (fourth embodiment) according to the invention.

Hereinafter, an electronic component handler and an electronic component tester according to a fourth embodiment of the invention will be described with reference to FIG. 18, differences from the aforementioned embodiments will be mainly described, and description of similar matters will be omitted.

The embodiment is similar to the aforementioned first embodiment other than the configuration of the remaining detection unit 3 is different.

The remaining detection unit 3 (electronic component handler 10) includes a horizontal direction moving mechanism unit 8 that supports the light irradiation unit 4 such that the light irradiation unit 4 can move in the XY plane direction (horizontal direction). Note that although the horizontal direction moving mechanism unit 8 is configured to move the light irradiation unit 4 in the Y direction in the embodiment, the horizontal direction moving mechanism unit 8 is not limited thereto and may be configured to move the light irradiation unit 4 in the X direction or to move the light irradiation unit 4 both in the X direction and in the Y direction, for example. In this manner, it is possible to adjust the position of the light irradiation unit 4 in the XY plane direction in accordance with the layout of the recessed portions 161 of the test unit 16. Through the adjustment, it is possible to accurately irradiate the target recessed portions 161 with the laser light L41 emitted from the respective laser light sources 41.

Note that the configuration of the horizontal direction moving mechanism unit 8 is not particularly limited and may have a configuration similar to that of the vertical direction moving mechanism unit 6, for example. That is, the horizontal direction moving mechanism unit 8 is configured to have a guide rail 81 that guides the light irradiation unit 4 in the Y direction, a slider 82 that supports the light irradiation unit 4 along with the vertical direction moving mechanism unit 6 and slides on the guide rail 81, and a movement adjustment unit 83 that adjusts the sliding of the slider 82.

Fifth Embodiment

Although an electronic component handler and an electronic component tester according to a fifth embodiment of the invention will be described below with reference to FIGS. 19 to 22, differences from the aforementioned embodiments will be mainly described, and description of similar matters will be omitted.

The embodiment is similar to the aforementioned first embodiment other than that the configuration of the laser light sources is different.

Figure 19:
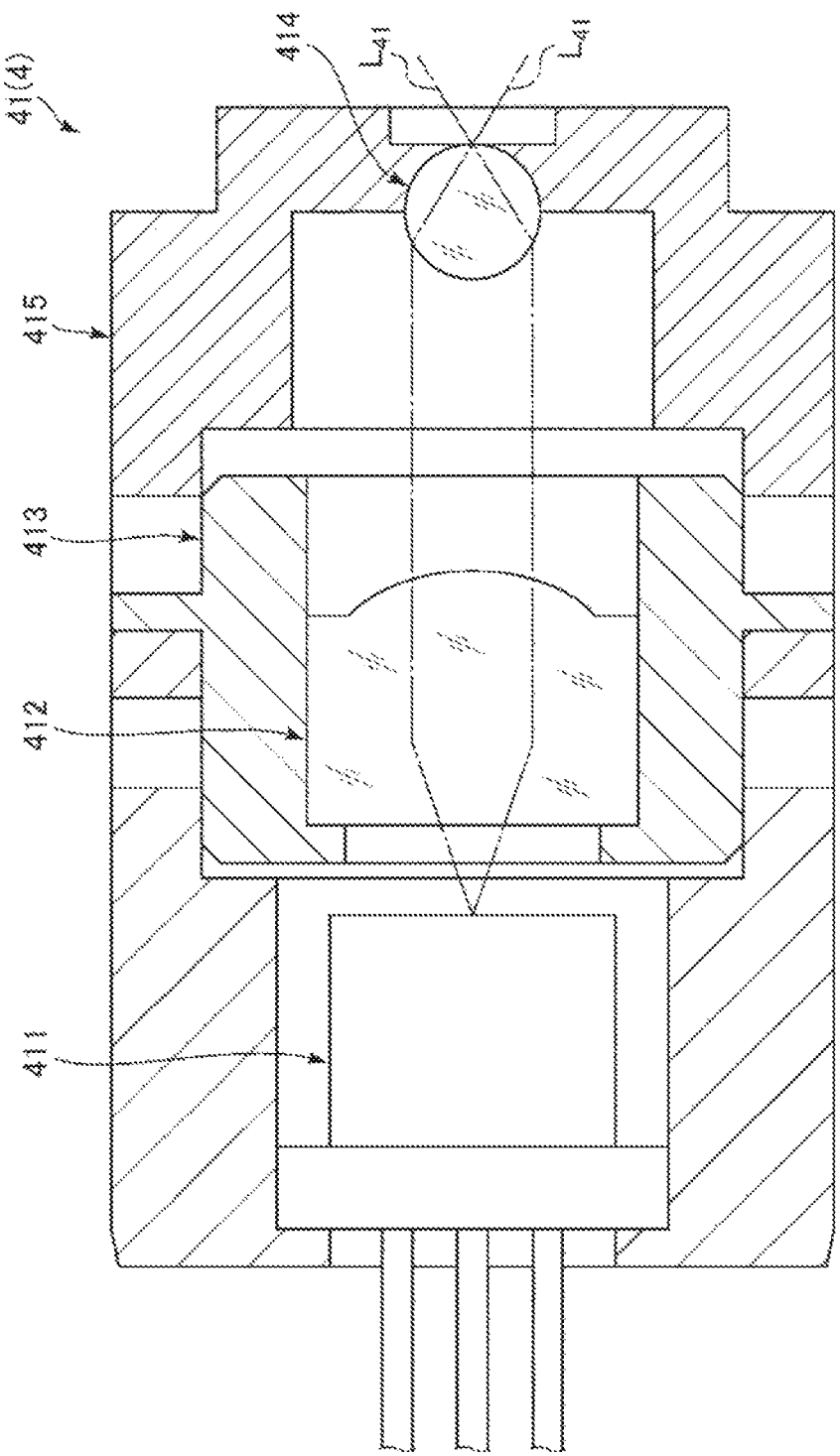
FIG. 19 is a vertical sectional view illustrating a structure of a light irradiation unit included in an electronic component tester (fifth embodiment) according to the invention.
Figure 19:
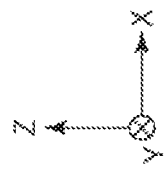

As illustrated in FIG. 19, each laser light source 41 according to the embodiment has a light emitting element 411 that emits the laser light L41, a collimate lens 412 that is located on the emitting side of the laser light L41 relative to the light emitting element 411, a support member 413 that movably supports the collimate lens 412 in an optical axis direction of the laser light L41, a rod lens 414 that is located on the emitting side of the laser light L41 relative to the collimate lens 412, and a casing 415 that collectively accommodates the light emitting element 411, the collimate lens 412, the support member 413, and the rod lens 414.

Each laser light source 41 with such a configuration can narrow down the beam waist by moving the support member 413 along with the collimate lens 412. In this manner, it is possible to reduce the width of the laser light L41 than the device size (the size of the device) and thereby to irradiate the device with the laser light L41 with a linear projection shape. In this manner, it is possible to direct the laser light L41 to a part of the IC device 90 and thereby to accurately detect remaining of the IC devices 90 in a case in which the IC devices 90 remain in the recessed portions 161.

According to the embodiment, it is also possible to change power of the respective laser light sources 41 for emitting the laser light L41. In this manner, it is possible to adjust luminance of the laser light L41 emitted from the respective laser light sources 41 on the test unit 16 to be the same. In this manner, it is possible to adjust the luminance to be the same at the respective measurement points, thereby to adjust a camera gain, and to satisfactorily perform imaging. Here, "changing the power for emitting the laser light L41" means causing an output value of the laser light L41 to exceed a range between a maximum value and a minimum value of rated output values of the laser light L41.

Figure 20:
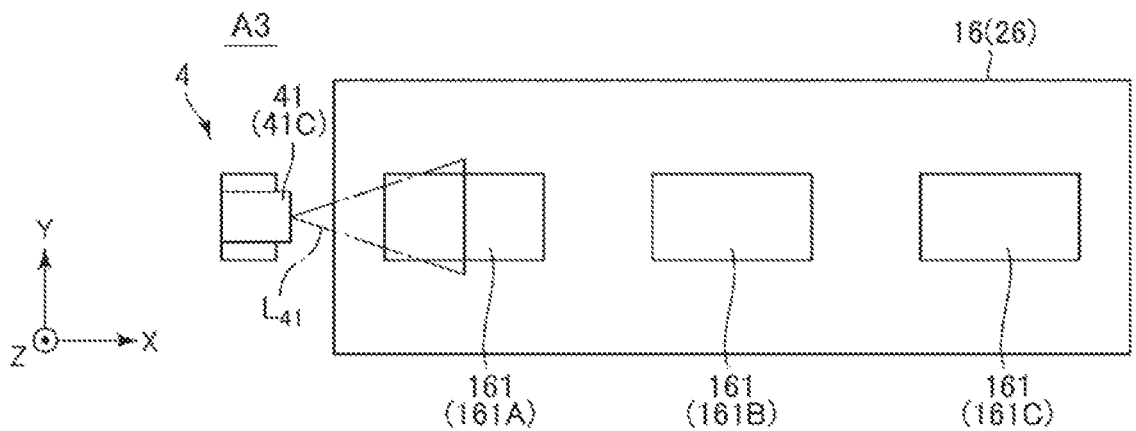
FIG. 20 is an enlarged plan view of the inside of a test region of the electronic component tester (fifth embodiment) according to the invention.
Figure 21:
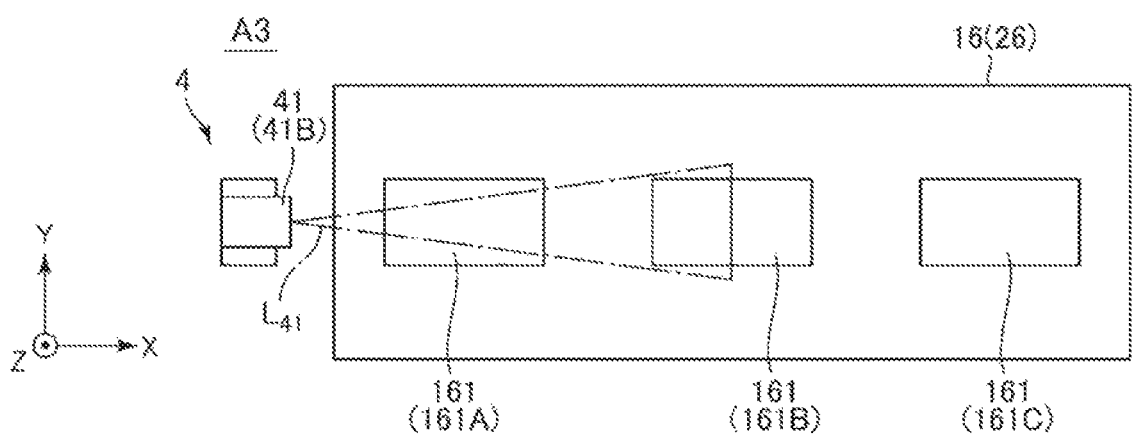
FIG. 21 is an enlarged plan view of the inside of the test region of the electronic component tester (fifth embodiment) according to the embodiment.
Figure 22:
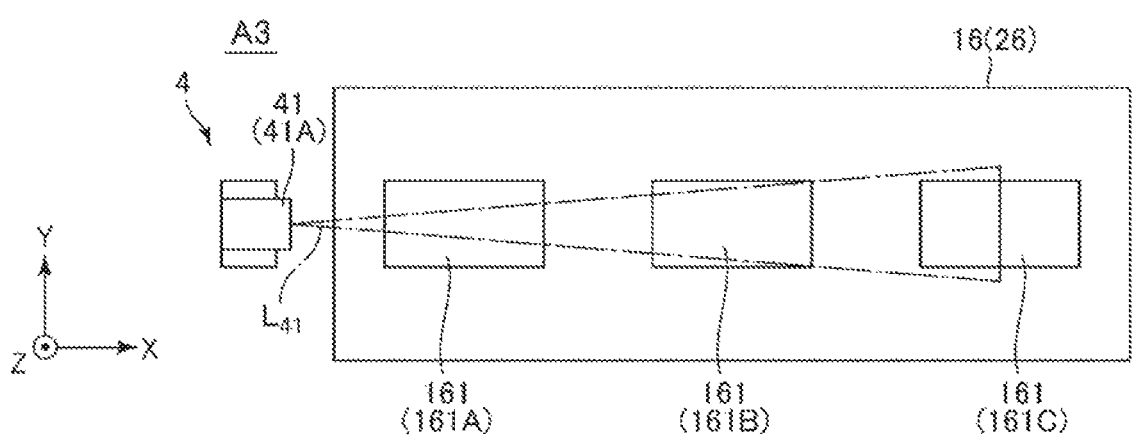
FIG. 22 is an enlarged plan view of the inside of the test region of the electronic component tester (fifth embodiment) according to the invention.

With the laser light sources 41 with such a configuration, it is possible to adjust the length of the projection shapes of the laser light L41 emitted from the respective laser light sources 41 in the Y direction to be the same as illustrated in FIGS. 20, 21, and 22. In this manner, it is possible to adjust luminance of the laser light L41 emitted from the respective laser light sources 41 on the test unit 16 to be the same.

Also, diameters of the rod lenses 414 (the lengths in the YZ plane direction) in the respective laser light sources 41 differ from each other. In this manner, it is possible to adjust the widths of the laser light L41 (slit light) emitted from the respective laser light sources 41. In a case in which each IC device 90 has a square shape in a plan view, and the length of one side thereof is 2 mm, for example, it is possible to adjust the width of the laser light L41 within 1 mm. In this manner, it is possible to direct the laser light L41 to a part of the IC device 90, and therefore, it is possible to accurately detect remaining of the IC devices 90 in a case in which the IC devices 90 remain in the recessed portions 161.

Although the embodiments of the electronic component handler and the electronic component tester according to the invention illustrated in the drawings have been described above, the invention is not limited thereto, and respective parts that form the electronic component handler and the electronic component tester can be replaced with parts with arbitrary configurations that can exhibit similar functions. Also, arbitrary configurations may be added thereto.

The electronic component handler and the electronic component tester according to the invention may be combinations of arbitrary two or more of configurations (features) of the aforementioned respective embodiments.

The entire disclosure of Japanese Patent Application No. 2018-010855, filed Jan. 25, 2018 is expressly incorporated by reference herein.

What is claimed is:

1. An electronic component handler that transports an electronic component to an electronic component placement unit on which the electronic component is placed, the handler comprising:
   a transport unit that transports the electronic component;
   a light irradiation unit that irradiates the electronic component placement unit with light; and
   a vertical direction moving mechanism unit having a guide that supports the light irradiation unit and guides the light irradiation unit in a vertical direction,
   wherein the vertical direction moving mechanism unit has a movement adjustment unit that adjusts a position of the light irradiation unit.

2. The electronic component handler according to claim 1, wherein the vertical direction moving mechanism unit has a decelerator that decelerates moving speed of the light irradiation unit.

3. The electronic component handler according to claim 1, wherein the light irradiation unit has a first laser light source that emits laser light along a first optical axis and a second laser light source that emits laser light along a second optical axis, and
   wherein the handler further comprises
   a first turning mechanism unit that turns the first laser light source, and
   a second turning mechanism unit that turns the second laser light source.

4. An electronic component handler that transports an electronic component to an electronic component placement unit on which the electronic component is placed, the handler comprising:
   a transport unit that transports the electronic component;
   a light irradiation unit that irradiates the electronic component placement unit with light; and
   a vertical direction moving mechanism unit having a guide that supports the light irradiation unit and guides the light irradiation unit in a vertical direction,
   wherein the light irradiation unit has a first laser light source that emits laser light along a first optical axis and a second laser light source that emits laser light along a second optical axis.

5. The electronic component handler according to claim 4, wherein the light irradiation unit has a support unit that supports the first laser light source and the second laser light source.

6. The electronic component handler according to claim 4, wherein the vertical direction moving mechanism unit has a first support unit that supports the first laser light source and a second support unit that supports the second laser light source.

7. The electronic component handler according to claim 4, wherein the first laser light source and the second laser light source are disposed in the vertical direction, and
   wherein when a straight line extending in the vertical direction is assumed to be a vertical line, an angle between the second optical axis of the second laser light source and the vertical line is smaller than an angle between the first optical axis of the first laser light source and the vertical line.

8. An electronic component handler that transports an electronic component to an electronic component placement unit on which the electronic component is placed, the handler comprising:
   a transport unit that transports the electronic component;
   a light irradiation unit that irradiates the electronic component placement unit with light;
   a vertical direction moving mechanism unit having a guide that supports the light irradiation unit and guides the light irradiation unit in a vertical direction; and
   a turning mechanism unit that turns the light irradiation unit.

9. The electronic component handler according to claim 8, wherein the turning mechanism unit has a decelerator that decelerates an angular speed of the light irradiation unit.

* * * * *